(12) United States Patent
Kuwana et al.

(10) Patent No.: US 9,599,829 B2
(45) Date of Patent: Mar. 21, 2017

(54) BIREFRINGENT LENS MATERIAL FOR STEREOSCOPIC IMAGE DISPLAY DEVICE AND METHOD FOR PRODUCING BIREFRINGENT LENS FOR STEREOSCOPIC IMAGE DISPLAY DEVICE

(71) Applicant: DIC CORPORATION, Tokyo (JP)

(72) Inventors: Yasuhiro Kuwana, Kitaadachi-gun (JP); Hiroshi Hasebe, Kitaadachi-gun (JP)

(73) Assignee: DIC CORPORATION, Tokyo (JP)

(*) Notice: Subject to any disclaimer, the term of this patent is extended or adjusted under 35 U.S.C. 154(b) by 0 days.

(21) Appl. No.: 14/513,701

(22) Filed: Oct. 14, 2014

(65) Prior Publication Data

US 2015/0030973 A1 Jan. 29, 2015

Related U.S. Application Data

(62) Division of application No. 13/976,874, filed as application No. PCT/JP2011/079488 on Dec. 20, 2011.

(30) Foreign Application Priority Data

Dec. 27, 2010 (JP) ................................ 2010-289909

(51) Int. Cl.
*G02B 27/22* (2006.01)
*G02B 1/04* (2006.01)
(Continued)

(52) U.S. Cl.
CPC ......... *G02B 27/2214* (2013.01); *B05D 3/067* (2013.01); *B29C 39/006* (2013.01);
(Continued)

(58) Field of Classification Search
CPC ...... G02B 1/04; G02B 1/041; G02B 27/2214; B05D 3/067; B29C 39/006; B29C 39/04; B29C 41/02
See application file for complete search history.

(56) References Cited

U.S. PATENT DOCUMENTS 6,676,851 B1 * 1/2004 Buchecker .............. C07C 69/92
252/299.61
6,730,241 B2   5/2004 Obi et al.
(Continued)

FOREIGN PATENT DOCUMENTS

CN      1287643 C      11/2006
CN     101127924 A     2/2008
(Continued)

OTHER PUBLICATIONS

Harrold, J. et al., "Switchable 2D/3D Display-Solid Phase Liquid Crystal Microlens Array", IDW, U.K., 2004, pp. 1495-1496.
(Continued)

*Primary Examiner* — Shamim Ahmed
*Assistant Examiner* — Bradford Gates
(74) *Attorney, Agent, or Firm* — Westerman, Hattori, Daniels & Adrian, LLP

(57) ABSTRACT

There is provided a method for producing a birefringent lens for a stereoscopic image display using a birefringent material having two or more liquid crystal compounds each having at least one polymerizable functional group. The method includes the steps of providing the birefringent lens material; applying the birefringent lens material onto an alignment layer that has been subjected to an alignment treatment in a uniaxial direction, and forming the coating film into a lens shape by conducting curing with ultraviolet light.

12 Claims, 1 Drawing Sheet

(51) Int. Cl.
*G02B 1/08* (2006.01)
*B05D 3/06* (2006.01)
*B29C 39/00* (2006.01)
*B29C 39/12* (2006.01)
*B29C 39/22* (2006.01)
*B32B 37/18* (2006.01)
*B32B 38/00* (2006.01)
*G03F 7/20* (2006.01)
*G02B 27/26* (2006.01)
*B29K 35/00* (2006.01)
*B29K 105/00* (2006.01)
*B29L 11/00* (2006.01)

(52) U.S. Cl.
CPC ............ *B29C 39/123* (2013.01); *B29C 39/22* (2013.01); *B32B 37/182* (2013.01); *B32B 38/0008* (2013.01); *G02B 1/04* (2013.01); *G02B 1/041* (2013.01); *G02B 1/08* (2013.01); *G03F 7/20* (2013.01); *B29K 2035/00* (2013.01); *B29K 2105/0002* (2013.01); *B29K 2105/0079* (2013.01); *B29K 2995/0032* (2013.01); *B29L 2011/0016* (2013.01); *B32B 2305/55* (2013.01); *B32B 2307/42* (2013.01); *B32B 2310/0831* (2013.01); *B32B 2333/04* (2013.01); *B32B 2551/00* (2013.01); *G02B 27/26* (2013.01)

(56) References Cited

U.S. PATENT DOCUMENTS

| | | | |
|---|---|---|---|
| 7,215,475 B2 * | 5/2007 | Woodgate et al. | 359/624 |
| 2003/0102458 A1 | 6/2003 | Nishikawa et al. | |
| 2004/0124793 A1 | 7/2004 | Park | |
| 2004/0222945 A1 | 11/2004 | Taira et al. | |
| 2005/0088740 A1 * | 4/2005 | Takeda et al. | 359/489 |
| 2006/0098285 A1 | 5/2006 | Woodgate et al. | |
| 2006/0170846 A1 * | 8/2006 | Ozawa | 349/114 |
| 2008/0113115 A1 * | 5/2008 | Ishizaki | 428/1.3 |
| 2009/0273834 A1 | 11/2009 | Korenaga | |
| 2010/0007806 A1 * | 1/2010 | Woodgate et al. | 349/15 |
| 2010/0195203 A1 | 8/2010 | Zuidema et al. | |
| 2011/0216271 A1 * | 9/2011 | Suzuki et al. | 349/71 |

FOREIGN PATENT DOCUMENTS

| | | |
|---|---|---|
| JP | 11-513360 A | 11/1999 |
| JP | 2003-160540 A | 6/2003 |
| JP | 2003-287620 A | 10/2003 |
| JP | 2004-538529 A | 12/2004 |
| JP | 2006-520919 A | 9/2006 |
| JP | 2007-519013 A | 7/2007 |
| JP | 2008-076789 A | 4/2008 |
| JP | 2008-222892 A | 9/2008 |
| JP | 2009-025489 A | 2/2009 |
| JP | 2009-520211 A | 5/2009 |
| JP | 2010-033420 A | 2/2010 |
| JP | 2010-151926 A | 7/2010 |
| JP | 2010-152069 A | 7/2010 |
| JP | 2010-241919 A | 10/2010 |
| JP | 2010-272275 A | 12/2010 |
| JP | 2012-008525 A | 1/2012 |
| JP | 2012-137725 A | 7/2012 |
| TW | 587074 B | 5/2004 |
| WO | 2008/142846 A1 | 11/2008 |

OTHER PUBLICATIONS

International Search Report dated Mar. 6, 2012, issued in corresponding application No. PCT/JP2011/079488.

* cited by examiner

BIREFRINGENT LENS MATERIAL FOR STEREOSCOPIC IMAGE DISPLAY DEVICE AND METHOD FOR PRODUCING BIREFRINGENT LENS FOR STEREOSCOPIC IMAGE DISPLAY DEVICE

CROSS-REFERENCE TO RELATED APPLICATIONS

This application is a Divisional of copending application Ser. No. 13/976,874, filed Aug. 5, 2013, which is a 371 of PCT International Application No. PCT/JP2011/079488 filed on Dec. 20, 2011, which based upon and claims the benefit of priority of the prior Japanese Patent Application No. 2010-289909, filed on Dec. 27, 2010. The entire contents of each of the above documents are hereby incorporated by reference into the present application.

TECHNICAL FIELD

The present invention relates to a birefringent lens material used for a stereoscopic image display and a method for producing a birefringent lens for a stereoscopic image display.

BACKGROUND ART

A stereoscopic image display provides a sense of depth by individually sending substantially two-dimensional images to the right eye and the left eye of a person, allowing the images to be integrated in the brain, and allowing the integrated image to be stereoscopically viewed. For this purpose, it is necessary to individually form images for generating a parallax in advance and to correct the images when the images are sent to the corresponding eyes, or it is necessary to separate a two-dimensional image into an image to be viewed by the right eye and an image to be viewed by the left eye.

In the method for separating a two-dimensional image, it is not necessary to wear polarized glasses or the like for correcting an image and thus a stereoscopic image can be viewed by the naked eye. Examples of the method for separating a two-dimensional image include a method using a lenticular lens and a parallax barrier method. The lenticular lens is a lens that separates an image into two images by determining the width of a certain image that can be viewed by one eye using refraction by the lens. As the lenticular lens, a birefringent lens having a shape in which semicylinders are arranged in a line is used for generating a parallax.

Regarding a characteristic required for the lenticular lens, a small change in the refractive index with respect to the temperature change is required in order to use the lenticular lens in a wide range of environments. To meet this requirement, a technique has been proposed in which a cured liquid crystal polymer is used as a material of a birefringent lens (refer to PTL 1 and NPL 1).

However, many different types of liquid crystal polymers exist, and in the case where a cured liquid crystal polymer is simply used as a material of a birefringent lens without studying the material in detail (refer to PTL 1), problems in terms of optical characteristics, durability, productivity, etc. of the lens may occur. A technique in which a bifunctional liquid crystalline monomer is used as a birefringent lens material is disclosed (NPL 1). However, this material has problems in terms of optical characteristics and productivity, and thus the application of this material as a birefringent lens material composed of a liquid crystal polymer has not proceeded.

CITATION LIST

Patent Literature

PTL 1: Japanese Unexamined Patent Application Publication (Translation of PCT Application) No. 2004-538529
Non Patent Literature
NPL 1: IDW '04, pp. 1495 and 1496

SUMMARY OF INVENTION

Technical Problem

Figure 1:
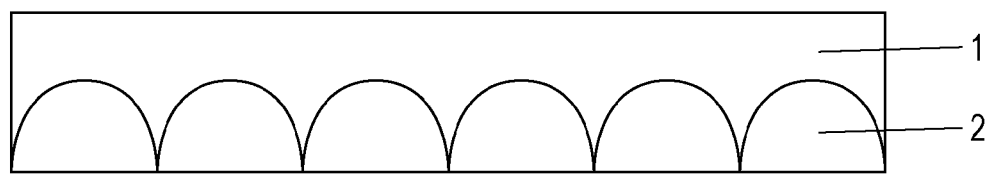
FIG. 1 illustrates a structure of a birefringent lens for a stereoscopic image display of the present invention.

An object of the present invention is to provide a birefringent lens material used for a stereoscopic image display and a birefringent lens for a stereoscopic image display, the birefringent lens material and birefringent lens having good optical characteristics, durability, and productivity, in particular, productivity. In addition, another object of the present invention is to provide a method for producing a birefringent lens for a stereoscopic image display, the method having good productivity.

Solution to Problem

The inventors of the present invention conducted intensive studies on various liquid crystal monomers used in a birefringent lens. As a result, it was found that, by using a birefringent lens material in which the number of types of particular liquid crystal monomers is increased, birefringent properties of the material can be changed, sufficient durability can be obtained, and curing at room temperature can be realized. This finding resulted in the completion of the present invention.

Specifically, the present invention provides a birefringent lens material for a stereoscopic image display, the birefringent lens material containing two or more liquid crystal compounds each having at least one polymerizable functional group, and a birefringent lens for a stereoscopic image display, the birefringent lens being formed by curing the lens material. In addition, the present invention provides a method for producing a birefringent lens for a stereoscopic image display, the method including applying the lens material onto an alignment layer that has been subjected to an alignment treatment in a uniaxial direction; and forming the resulting coating film into a lens shape by conducting curing with ultraviolet light.

Advantageous Effects of Invention

According to the birefringent lens material for a stereoscopic image display of the present invention and the birefringent lens for a stereoscopic image display produced by using the lens material, good optical characteristics, good durability, and good productivity can be achieved by increasing the number of types of particular liquid crystal monomers.

In addition, the method for producing a birefringent lens for a stereoscopic image display using the above material can suppress the generation of alignment defects of a liquid crystal monomer and has good productivity.

DESCRIPTION OF EMBODIMENTS

A birefringent lens material for a stereoscopic image display of the present invention contains two or more liquid crystal compounds each having at least one polymerizable functional group. From the standpoint of durability, the liquid crystal compounds each having at least one polymerizable functional group are preferably two or more liquid crystal compounds each having at least two polymerizable functional groups. The liquid crystal compounds each having at least two polymerizable functional groups are contained in an amount of preferably 10% to 95% by weight, and more preferably 15% to 90% by weight. In addition, the liquid crystal compounds having polymerizable functional groups preferably have the same mesogenic group or the same mesogenity supporting group.

Each of the liquid crystal compounds having at least one polymerizable functional group is preferably a compound represented by general formula (1):

[Chem. 1]

P—(Sp)$_m$-MG-R$^1$      (1)

(where P represents a polymerizable functional group; Sp represents a spacer group having 0 to 18 carbon atoms; m represents 0 or 1; MG represents a mesogenic group or a mesogenity supporting group; and R$^1$ represents a halogen atom, a cyano group, a thiocyanate group, a hydroxy group, an NCO group, an OCN group, or an alkyl group having 1 to 18 carbon atoms, the alkyl group may be substituted with at least one selected from halogen atoms, a cyano group, and a hydroxy group, and one CH$_2$ group or two or more non-adjacent CH$_2$ groups present in this group may each be independently substituted with a divalent organic group such as —O—, —S—, —NH—, —N(CH$_3$)—, —CO—, —COO—, —OCO—, —OCOO—, —SCO—, —COS—, —CH=CH—, or —C≡C— in such a manner that oxygen atoms are not directly bonded to each other, or R$^1$ represents a structure represented by general formula (1-a):

[Chem. 2]

—(Sp)$_m$-P      (1-a)

(where P represents a polymerizable functional group, Sp represents a spacer group having 0 to 18 carbon atoms, and m represents 0 or 1).)

The birefringent lens material for a stereoscopic image display of the present invention preferably has a transition temperature from a solid phase to a liquid-crystalline phase of −10° C. or lower, and a transition temperature from a liquid-crystalline phase to a liquid phase of 50° C. or higher. The transition temperature from a solid phase to a liquid-crystalline phase is preferably 0° C. or lower, and the transition temperature from a liquid-crystalline phase to a liquid phase is preferably 40° C. or higher.

The birefringent lens material for a stereoscopic image display of the present invention is preferably a material that can be polymerized at a room temperature of 20° C. to 30° C.

a) (Liquid Crystal Compound Having One Polymerizable Functional Group)

In the birefringent lens material for a stereoscopic image display of the present invention, a liquid crystal compound having one polymerizable functional group exhibits liquid crystallinity alone or in a composition containing other liquid crystal compounds. The liquid crystal compound is not particularly limited as long as the compound has one polymerizable functional group, and well-known, commonly used compounds can be used.

Examples thereof include rod-shaped polymerizable liquid crystal compounds having a rigid portion which is called a "mesogen" in which a plurality of structures such as a 1,4-phenylene group and a 1,4-cyclohexylene group are connected to each other and a polymerizable functional group such as a vinyl group, an acrylic group, or a (meth)acrylic group, the rod-shaped polymerizable liquid crystal compounds being described in, for example, Handbook of Liquid Crystals (Edited by D. Demus, J. W. Goodby, G. W. Gray, H. W. Spiess, and V. Vill, published by Wiley-VCH, 1998), Kikan Kagaku Sosetsu (Survey of Chemistry, Quarterly) No. 22, Chemistry of liquid crystal (edited by the Chemical Society of Japan, 1994), or Japanese Unexamined Patent Application Publication Nos. 7-294735, 8-3111, 8-29618, 11-80090, 11-116538, or 11-148079; and rod-shaped polymerizable liquid crystal compounds having a maleimide group, the rod-shaped polymerizable liquid crystal compounds being described in Japanese Unexamined Patent Application Publication Nos. 2004-2373 and 2004-99446. Among these, rod-shaped polymerizable liquid crystal compounds each having a polymerizable group are preferable from the standpoint that a material having a liquid crystal temperature range including a low temperature of about room temperature can be easily prepared.

Specific examples thereof preferably include compounds represented by general formula (1):

[Chem. 3]

P—(Sp)$_m$-MG-R$^1$      (1)

(where P represents a polymerizable functional group; Sp represents a spacer group having 0 to 18 carbon atoms; m represents 0 or 1; MG represents a mesogenic group or a mesogenity supporting group; and R$^1$ represents a halogen atom, a cyano group, a thiocyanate group, a hydroxy group, an NCO group, an OCN group, or an alkyl group having 1 to 18 carbon atoms, the alkyl group may be substituted with at least one selected from halogen atoms, a cyano group, and a hydroxy group, and one CH$_2$ group or two or more non-adjacent CH$_2$ groups present in this group may each be independently substituted with a divalent organic group such as —O—, —S—, —NH—, —N(CH$_3$)—, —CO—, —COO—, —OCO—, —OCOO—, —SCO—, —COS—, —CH=CH—, or —C≡C— in such a manner that oxygen atoms are not directly bonded to each other.)

Well-known, commonly used polymerizable functional groups are used as the polymerizable functional group of the compound represented by general formula (1). Examples of the polymerizable functional group include a vinyl group, an allyl group, a styryl group, a vinyl ether group, an allyl ether group, an acrylic group, a (meth)acrylic group, an acrylamide group, a (meth)acrylamide group, a glycidyl group, a glycidyl ether group, an oxetanyl group, an oxetanyl ether group, a cyanuric group, an isocyanuric group, a maleimide group, a maleimide carboxyl group, a thiol group, a dialkyl fumarate group, an acetylenyl group, an organosilyl group, and functional groups that can be subjected to cyclopolymerization or ring-opening polymerization. Each of the polymerizable functional groups may have a substituent such as a halogen atom, a methyl group, or a trifluoromethyl group as long as the polymerizability is not impaired.

The mesogenic group or the mesogenity supporting group of the compound represented by general formula (1) includes a ring structure and a group that connects the ring structure, and is represented by, for example, general formula (1-1):

[Chem. 4]

$$-Sp_1-(MG_1-Sp_2)_n-MG_2-Sp_3-$$ (1-1)

(In the formula, $MG_1$ and $MG_2$ each independently represent at least one ring structure, $Sp_1$, $Sp_2$, and $Sp_3$ each independently represent a single bond or a divalent organic group, in the case where one ring structure can function as a mesogenic group or a mesogenity supporting group, n represents 0 to 5, and in the case where two or more ring structures can function as a mesogenic group or a mesogenity supporting group, n represents 1 to 6.)

In general formula (1-1), examples of $MG_1$ and $MG_2$ each having at least one ring structure include well-known, commonly used structures, and specific examples thereof include the following:

[Chem. 5]

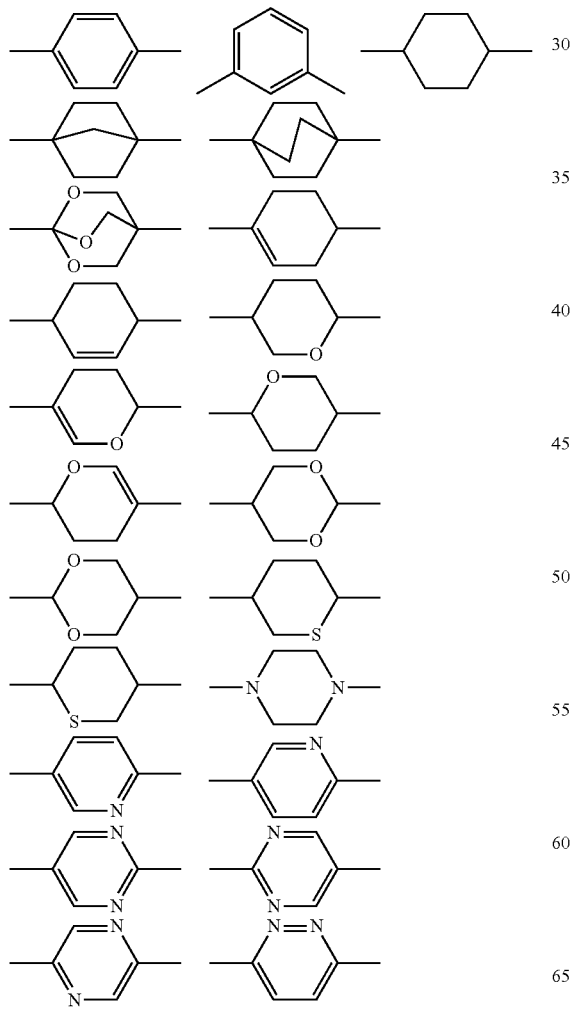

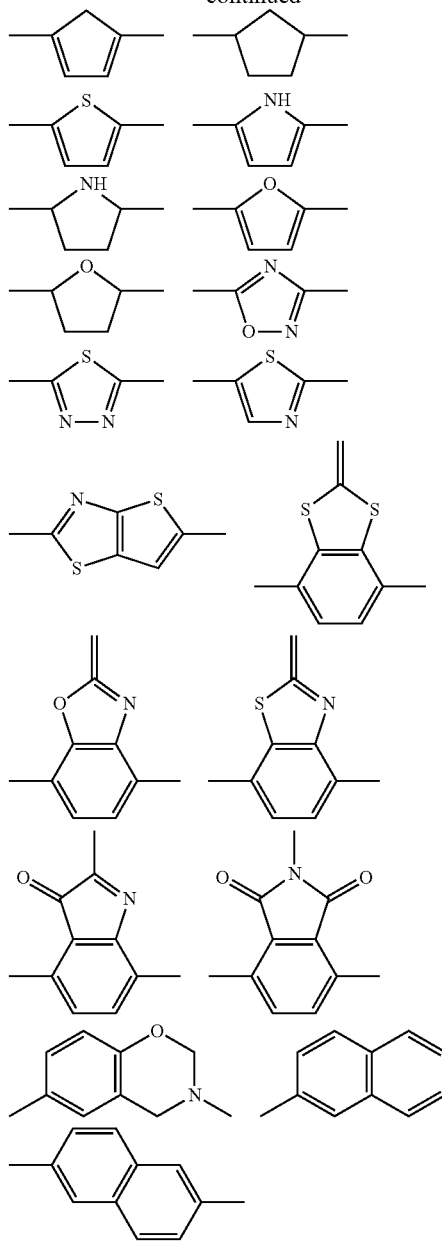

[Chem. 6]

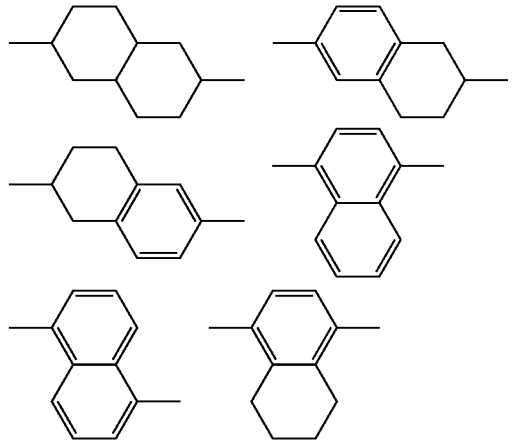

-continued

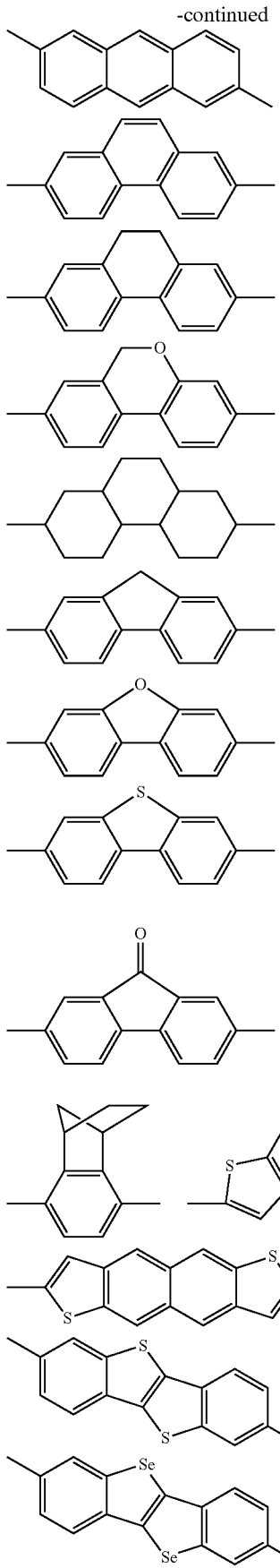

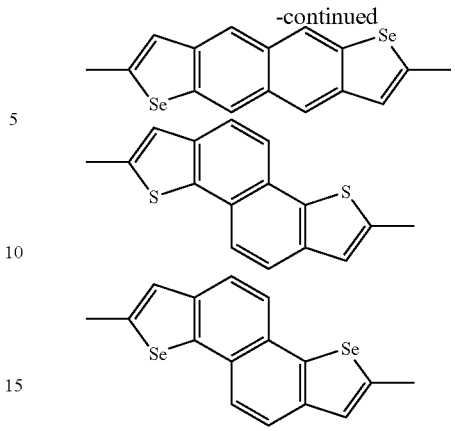

(In the formulae, each structure may have, as at least one substituent, at least one selected from F, Cl, CF$_3$, OCF$_3$, a CN group, alkyl groups each having 1 to 8 carbon atoms, alkoxy groups each having 1 to 8 carbon atoms, alkanoyl groups each having 1 to 8 carbon atoms, alkanoyloxy groups each having 1 to 8 carbon atoms, alkenyl groups each having 2 to 8 carbon atoms, alkenyloxy groups each having 2 to 8 carbon atoms, alkenoyl groups each having 2 to 8 carbon atoms, and alkenoyloxy groups each having 2 to 8 carbon atoms.)

In general formula (1-1), Sp$_1$, Sp$_2$, and Sp$_3$ are each preferably, for example, a single bond or a divalent organic group such as —COO—, —OCO—, —COS—, —SCO—, —OCOO—, —CH$_2$CH$_2$—, —OCH$_2$—, —CH$_2$O—, —OCF$_2$—, —CF$_2$O—, —CH═CH—, —CH═N—, —CF═CF—, —N═N—, —C═N—N═C—, —C≡C—, —CH═CHCOO—, —OCOCH═CH—, —CH═CHCOS—, —SCOCH═CH—, —CH$_2$CH$_2$COO—, —CH$_2$CH$_2$OCO—, —COOCH$_2$CH$_2$—, —OCOCH$_2$CH$_2$—, —CONH—, —NHCO—, or an alkylene group which has 2 to 10 carbon atoms and which may have a halogen atom.

More specifically, preferable are compounds represented by general formula (1) wherein Sp represents a single bond or an alkylene group (where the alkylene group may be substituted with at least one selected from halogen atoms and CN, and one CH$_2$ group or two or more non-adjacent CH$_2$ groups present in this group may each be independently substituted with —O—, —S—, —NH—, —N(CH$_3$)—, —CO—, —COO—, —OCO—, —OCOO—, —SCO—, —COS—, —CONH—, —NHCO—, —CH═CH—, or —C≡C— in such a manner that oxygen atoms are not directly bonded to each other), and MG is represented by general formula (1-b):

[Chem. 7]

—Z0-(A1-Z1)$_n$-A2-Z2-A3-Z3-     (1-b)

(where A1, A2, and A3 each independently represent a 1,4-phenylene group, a 1,4-cyclohexylene group, a 1,4-cyclohexenyl group, a tetrahydropyran-2,5-diyl group, a 1,3-dioxane-2,5-diyl group, a tetrahydrothiopyran-2,5-diyl group, a 1,4-bicyclo[2.2.2]octylene group, a decahydronaphthalene-2,6-diyl group, a pyridine-2,5-diyl group, a pyrimidine-2,5-diyl group, a pyrazine-2,5-diyl group, a thiophene-2,5-diyl group, a 1,2,3,4-tetrahydronaphthalene-2,6-diyl group, a 1,4-naphthylene group, a 1,5-naphthylene group, a 1,6-naphthylene group, a 2,6-naphthylene group, a phenanthrene-2,7-diyl group, a 9,10-dihydrophenanthrene- 2,7-diyl group, a 1,2,3,4,4a,9,10a-octahydrophenanthrene-2,7-diyl group, a benzo[1,2-b:4,5-b']dithiophene-2,6-diyl group, a benzo[1,2-b:4,5-b']diselenophene-2,6-diyl group, a [1]benzothieno[3,2-b]thiophene-2,7-diyl group, a [1]benzoselenopheno[3,2-b]selenophene-2,7-diyl group, a fluorene-2,7-diyl group, or the like, and may have, as at least one substituent, at least one selected from F, CL, $CF_3$, $OCF_3$, a CN group, alkyl group each having 1 to 8 carbon atoms, alkoxy groups each having 1 to 8 carbon atoms, alkanoyl groups each having 1 to 8 carbon atoms, alkanoyloxy groups each having 1 to 8 carbon atoms, alkenyl groups each having 2 to 8 carbon atoms, alkenyloxy groups each having 2 to 8 carbon atoms, alkenoyl groups each having 2 to 8 carbon atoms, and alkenoyloxy groups each having 2 to 8 carbon atoms; Z0, Z1, Z2, and Z3 each independently represent —COO—, —OCO—, —$CH_2CH_2$—, —$OCH_2$—, —$CH_2O$—, —$OCF_2$—, —$CF_2O$—, —$CH_2S$—, —$SCH_2$—, —CH=CH—, —CF=CF—, —C≡C—, —CH=CHCOO—, —OCOCH=CH—, —$CH_2CH_2COO$—, —$CH_2CH_2OCO$—, —$COOCH_2CH_2$—, —$OCOCH_2CH_2$—, —OCO=COO—, —CONH—, —NHCO—, an alkylene group which has 2 to 10 carbon atoms and which may have a halogen atom, or a single bond; and n represents 0, 1, or 2.))

The polymerizable functional group is preferably any of an acrylic group, a (meth)acrylic group, an acrylamide group, a vinyl group, a vinyl ether group, a glycidyl group, a glycidyl ether group, an oxetanyl group, an oxetanyl ether group, a maleimide group, a maleimide carboxyl group, a thiol group, etc. represented by general formulae (P-1) to (P-18):

[Chem. 8]

(P-1)

(P-2)

(P-3)

(P-4)

(P-5)

(P-6)

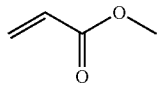
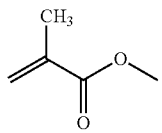
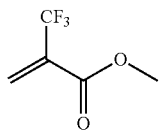
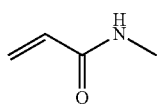
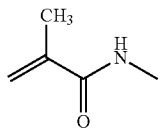
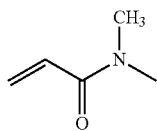

-continued (P-7)
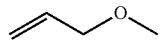

(P-8)
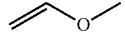

(P-9)
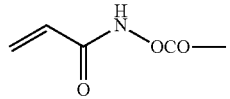

(P-10)
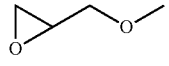

(P-11)
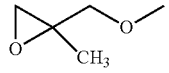

(P-12)

(P-13)
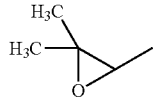

(P-14)

(P-15)
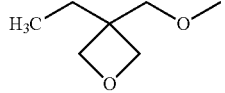

(P-16)
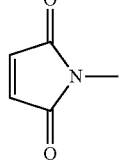

(P-17)
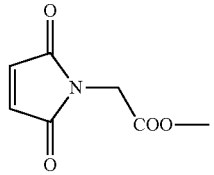

(P-18)
—SH

From the standpoint of productivity, a vinyl ether group, an acrylic group, a (meth)acrylic group, a glycidyl group, and a glycidyl ether group are particularly preferable.

Furthermore, the liquid crystal compound having one polymerizable functional group is preferably a compound selected from the compound group represented by general formulae (3) and (4):

[Chem. 9]

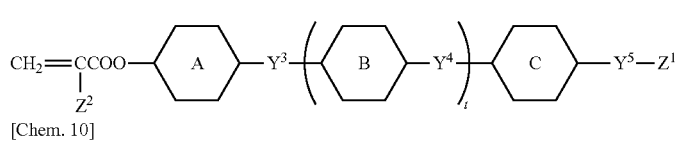
(3)

[Chem. 10]

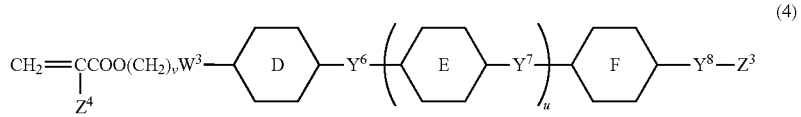
(4)

(In the formulae, $Z^1$ and $Z^3$ each independently represent a hydrogen atom, a halogen atom, a cyano group, or a hydrocarbon group having 1 to 18 carbon atoms; $Z^2$ and $Z^4$ each independently represent a hydrogen atom or a methyl group; t and u each independently represent 0, 1, or 2; v represents an integer of 2 to 18; $W^3$ represents a single bond, —O—, —COO—, or —OCO—; A, B, C, D, E, and F each independently represent a 1,4-phenylene group, a 1,4-phenylene group in which non-adjacent CH groups are each substituted with nitrogen, a 1,4-cyclohexylene group, a 1,4-cyclohexylene group in which one or non-adjacent two CH$_2$ groups are each substituted with an oxygen or sulfur atom, a 1,4-cyclohexenyl group, a 1,4-bicyclo[2.2.2]octylene group, a decahydronaphthalene-2,6-diyl group, a pyridine-2,5-diyl group, a pyrimidine-2,5-diyl group, a pyrazine-2,5-diyl group, a 1,2,3,4-tetrahydronaphthalene-2,6-diyl group, a 2,6-naphthylene group, or a 1,4-naphthylene group, and a 1,4-phenylene group and a 2,6-naphthylene group that are present in the formulae may each be substituted with at least one selected from alkyl groups each having 1 to 7 carbon atoms, alkoxy groups each having 1 to 7 carbon atoms, alkanoyl groups each having 1 to 7 carbon atoms, a cyano group, and halogen atoms; $Y^3$, $Y^4$, $Y^6$, and $Y^7$ each independently represent a single bond, —CH$_2$CH$_2$—, —CH$_2$O—, —OCH$_2$—, —COO—, —OCO—, —C≡C—, —CH=CH—, —CF=CF—, —(CH$_2$)$_4$—, —CH$_2$CH$_2$CH$_2$O—, —OCH$_2$CH$_2$CH$_2$—, —CH=CHCH$_2$CH$_2$—, —CH$_2$CH$_2$CH=CH—, —CH=CHCOO—, —OCOCH=CH—, —CH$_2$CH$_2$COO—, —CH$_2$CH$_2$OCO—, —COOCH$_2$CH$_2$—, or —OCOCH$_2$CH$_2$—; and $Y^5$ and $Y^8$ each independently represent a single bond, —O—, —COO—, —OCO—, or —CH=CHCOO—.)

Exemplary compounds are shown below but are not limited thereto.

[Chem. 11]

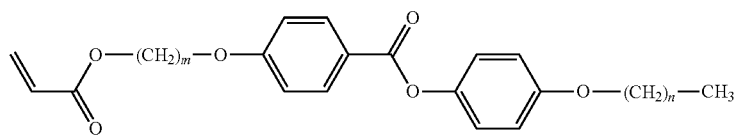
(a-1)

[Chem. 12]

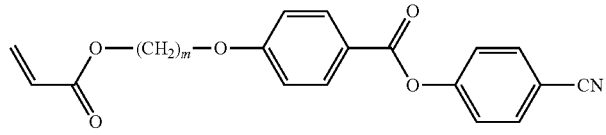
(a-2)

[Chem. 13]

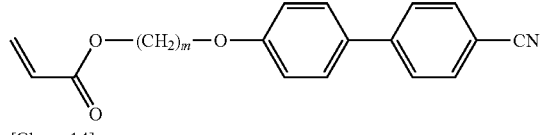
(a-3)

[Chem. 14]

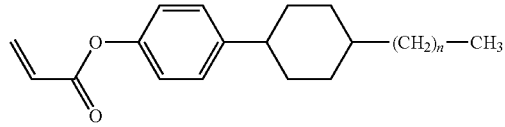
(a-4)

[Chem. 15]
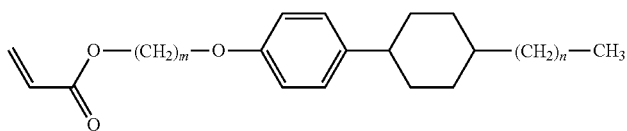
(a-5)
[Chem. 16]
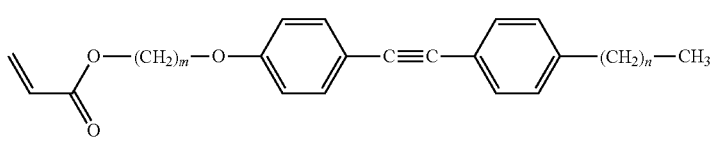
(a-6)
[Chem. 17]
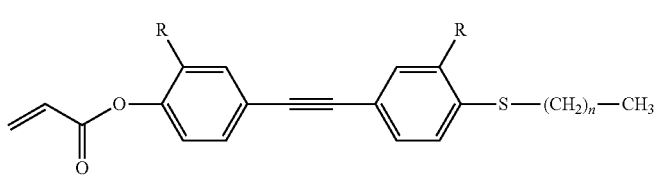
(a-7)
[Chem. 18]
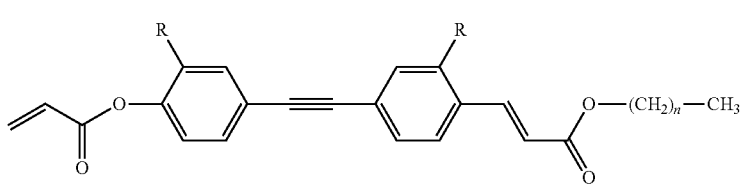
(a-8)
[Chem. 19]
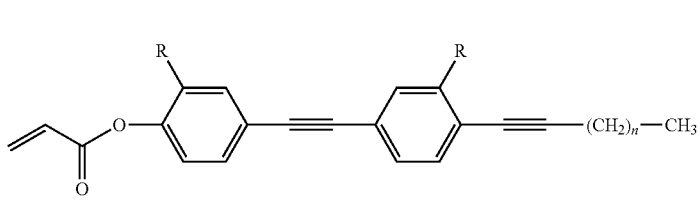
(a-9)
[Chem. 20]
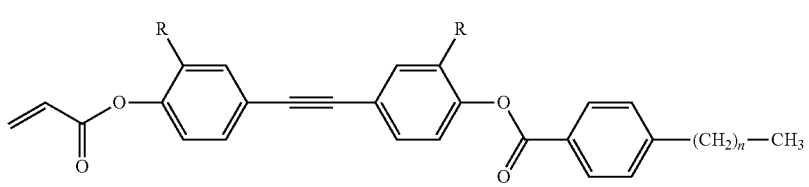
(a-10)
[Chem. 21]
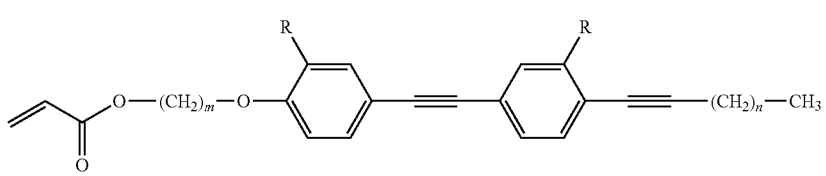
(a-11)

[Chem. 22]
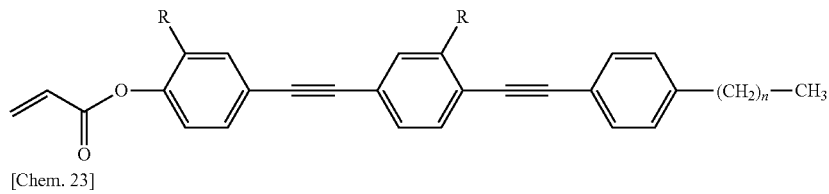
(a-12)
[Chem. 23]
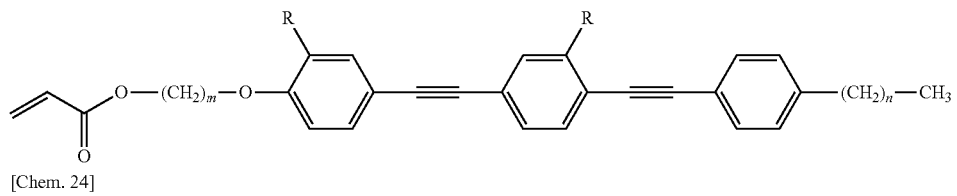
(a-13)
[Chem. 24]
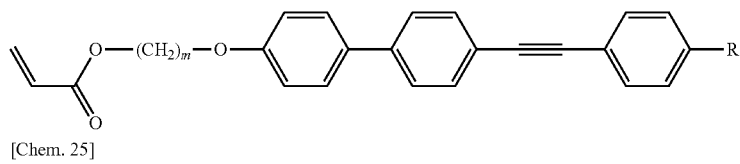
(a-14)
[Chem. 25]
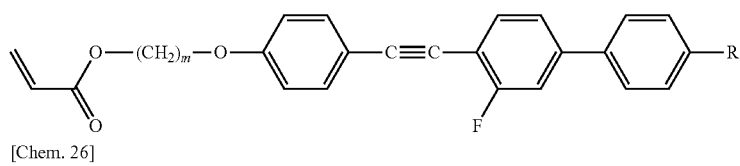
(a-15)
[Chem. 26]
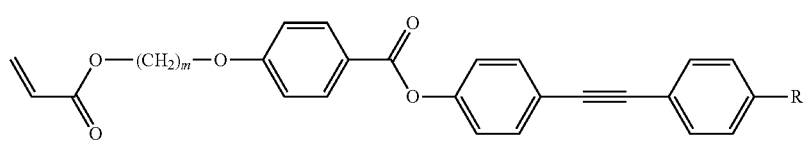
(a-16)
[Chem. 27]
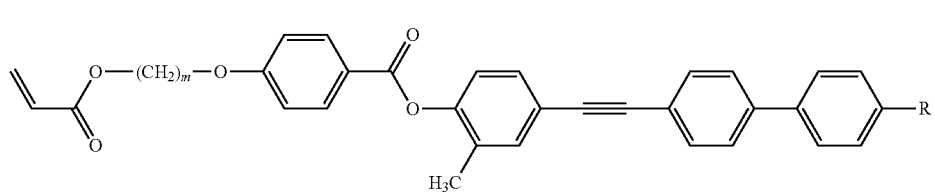
(a-17)
[Chem. 28]
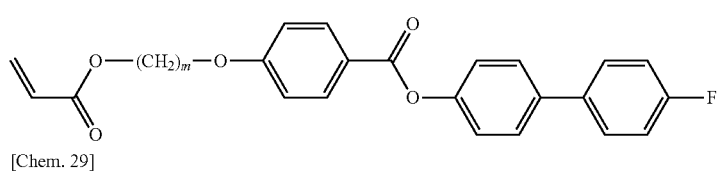
(a-18)
[Chem. 29]
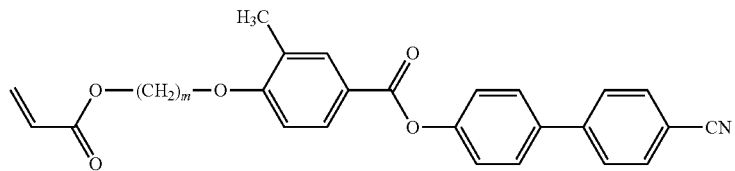
(a-19)

-continued
[Chem. 30]
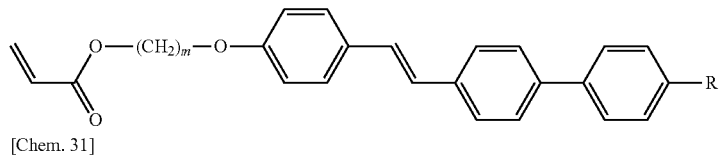
(a-20)
[Chem. 31]
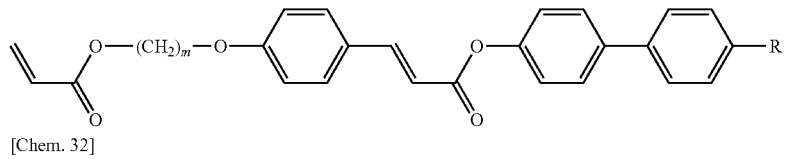
(a-21)
[Chem. 32]
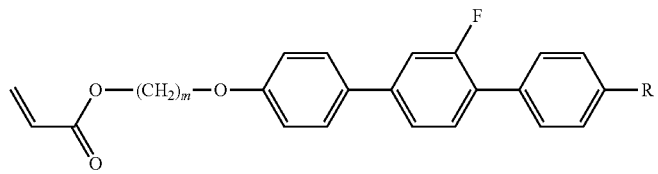
(a-22)
[Chem. 33]
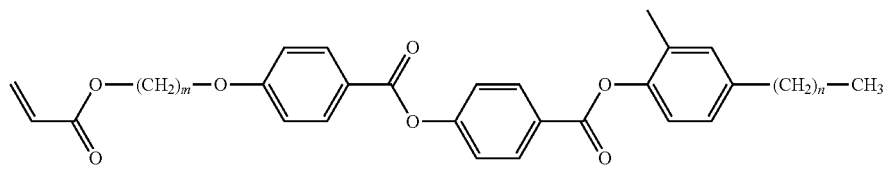
(a-23)
[Chem. 34]
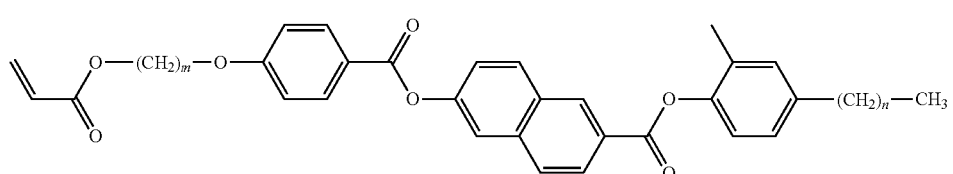
(a-24)
[Chem. 35]
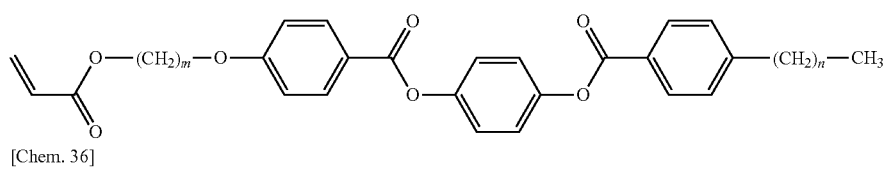
(a-25)
[Chem. 36]
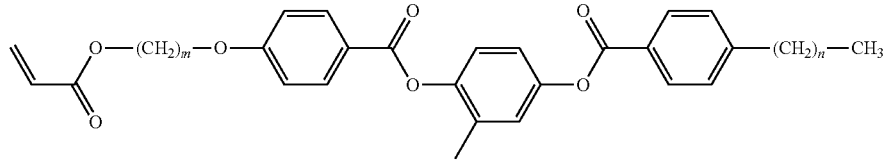
(a-26)
[Chem. 37]
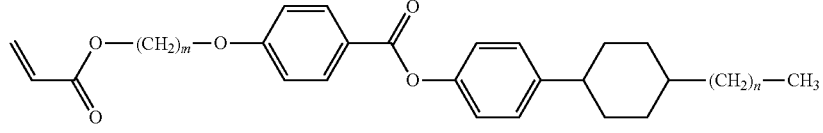
(a-27)

-continued
[Chem. 38]
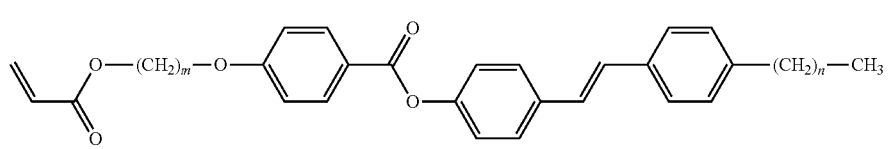
(a-28)
[Chem. 39]
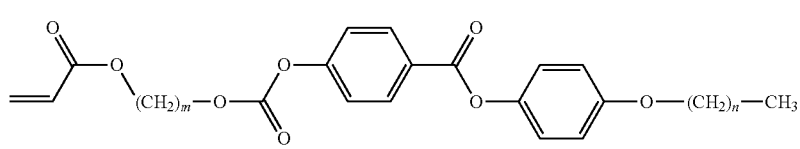
(a-29)
[Chem. 40]
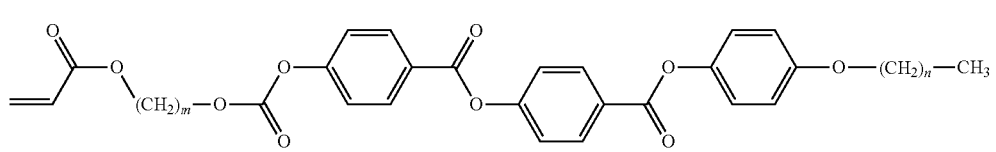
(a-30)
[Chem. 41]
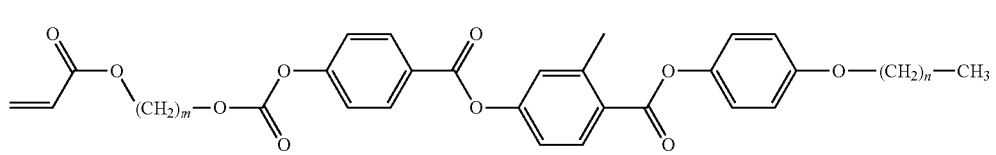
(a-31)
[Chem. 42]
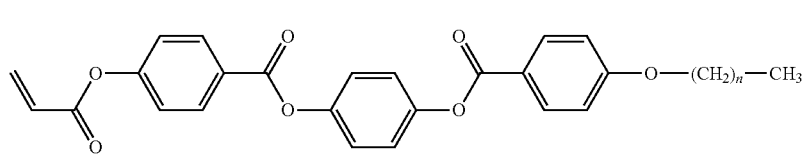
(a-32)
[Chem. 43]
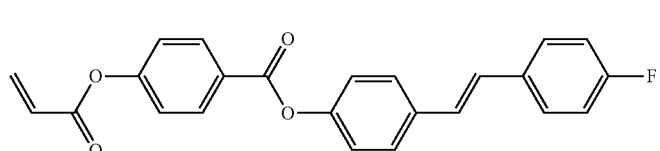
(a-33)
[Chem. 44]
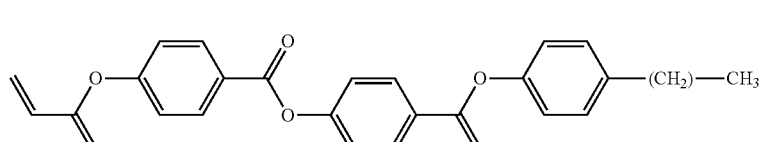
(a-34)
[Chem. 45]
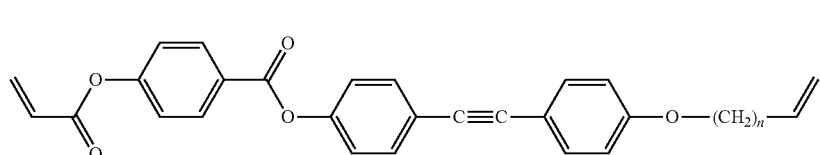
(a-35)

-continued
[Chem. 46]
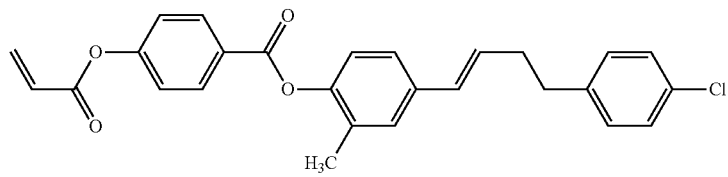
(a-36)
[Chem. 47]
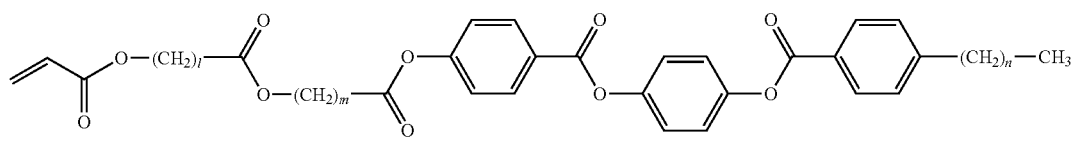
(a-37)
[Chem. 48]
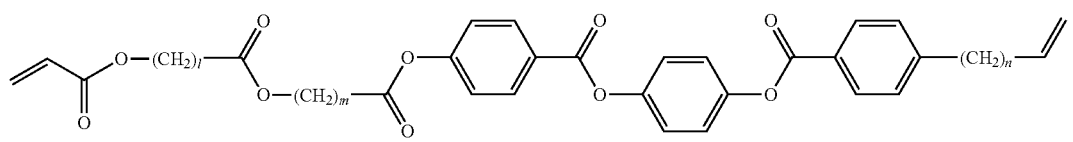
(a-38)
[Chem. 49]
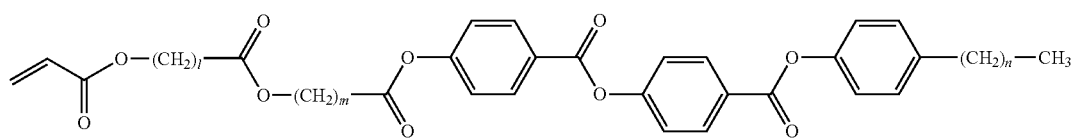
(a-39)
[Chem. 50]
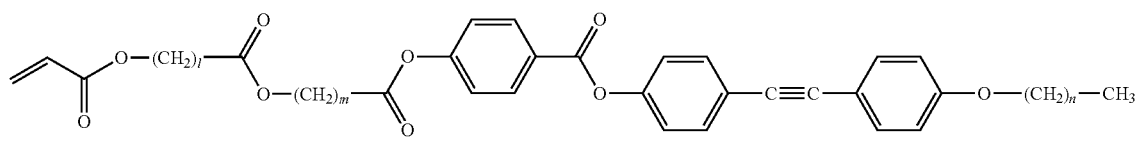
(a-40)
[Chem. 51]
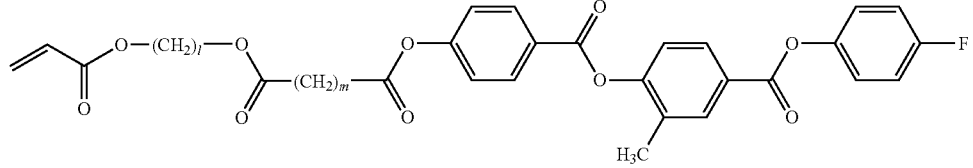
(a-41)
[Chem. 52]
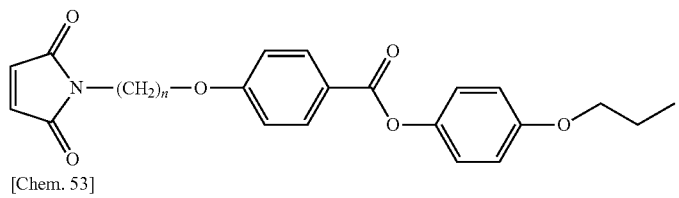
(a-42)
[Chem. 53]
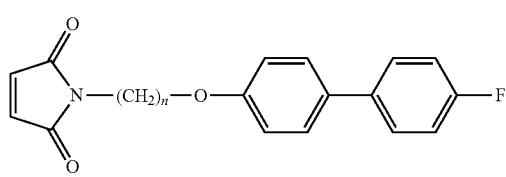
(a-43)

[Chem. 54]

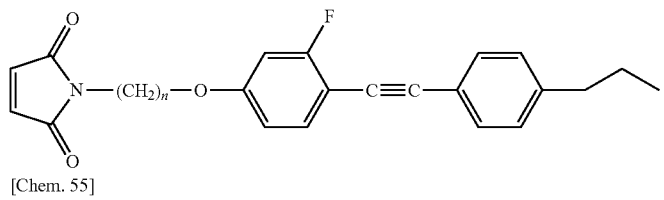

(a-44)

[Chem. 55]

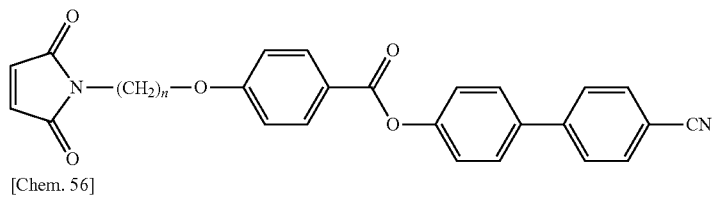

(a-45)

[Chem. 56]

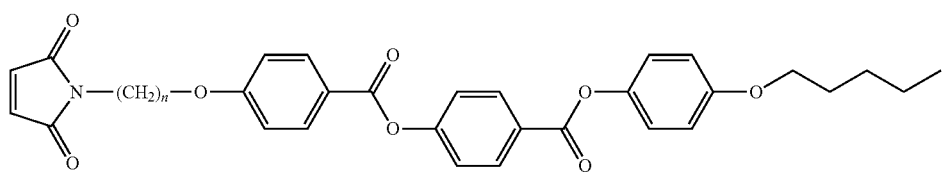

(a-46)

(In the formulae, m represents an integer of 2 to 18, n represents an integer of 0 to 18, and R represents a hydrogen atom, an alkyl group having 1 to 6 carbon atoms, an alkoxy group having 1 to 6 carbon atoms, a carboxyl group, or a cyano group. In the case where any of these groups is an alkyl group having 1 to 6 carbon atoms or an alkoxy group having 1 to 6 carbon atoms, the group may be unsubstituted or substituted with one or two or more halogen atoms.) These liquid crystal compounds may be used alone or in combination of two or more compounds.

b) (Liquid Crystal Compound Having Two or More Polymerizable Functional Groups)

A liquid crystal compound having two or more polymerizable functional groups and used in the birefringent lens material for a stereoscopic image display of the present invention exhibits liquid crystallinity alone or in a composition containing other liquid crystal compounds. The liquid crystal compound is not particularly limited as long as the compound has two or more polymerizable functional groups, and well-known, commonly used compounds can be used.

Examples thereof include rod-shaped polymerizable liquid crystal compounds having a rigid portion which is called a "mesogen" in which a plurality of structures such as a 1,4-phenylene group and a 1,4-cyclohexylene group are connected to each other and polymerizable functional groups such as a vinyl group, an acrylic group, or a (meth)acrylic group, the rod-shaped polymerizable liquid crystal compounds being described in, for example, Handbook of Liquid Crystals (Edited by D. Demus, J. W. Goodby, G. W. Gray, H. W. Spiess, and V. Vill, published by Wiley-VCH, 1998), Kikan Kagaku Sosetsu (Survey of Chemistry, Quarterly) No. 22, Chemistry of liquid crystal (edited by the Chemical Society of Japan, 1994), or Japanese Unexamined Patent Application Publication Nos. 4-227684, 11-80090, 11-116538, 11-148079, 2000-178233, 2002-308831, 2002-145830, and 2004-125842; and rod-shaped polymerizable liquid crystal compounds having a maleimide group, the rod-shaped polymerizable liquid crystal compounds being described in Japanese Unexamined Patent Application Publication Nos. 2004-2373 and 2004-99446. Among these, rod-shaped polymerizable liquid crystal compounds having polymerizable groups are preferable from the standpoint that a material having a liquid crystal temperature range including a low temperature of about room temperature can be easily prepared.

Specific examples thereof preferably include compounds represented by general formula (1):

[Chem. 57]

$$P—(Sp)_m\text{-MG-}R^1 \qquad (1)$$

(where P represents a polymerizable functional group; Sp represents a spacer group having 0 to 18 carbon atoms; m represents 0 or 1; MG represents a mesogenic group or a mesogenity supporting group; and $R^1$ is represented by general formula (1-a):

[Chem. 58]

$$—(Sp)_m\text{-P} \qquad (1\text{-a})$$

(where P represents a polymerizable functional group, Sp represents a spacer group having 0 to 18 carbon atoms, and m represents 0 or 1).) Well-known, commonly used polymerizable functional groups are used as the polymerizable functional group in general formula (1). Examples of the polymerizable functional group include a vinyl group, an allyl group, a styryl group, a vinyl ether group, an allyl ether group, an acrylic group, a (meth)acrylic group, an acrylamide group, a (meth)acrylamide group, a glycidyl group, a glycidyl ether group, an oxetanyl group, an oxetanyl ether group, a cyanuric group, an isocyanuric group, a maleimide group, a maleimide carboxyl group, a thiol group, a dialkyl fumarate group, an acetylenyl group, an organosilyl group, and functional groups that can be subjected to cyclopolymerization or ring-opening polymerization. Each of the polymerizable functional groups may have a substituent such as a halogen atom, a methyl group, or a trifluoromethyl group as long as the polymerizability is not impaired.

The mesogenic group or the mesogenity supporting group in general formula (1) includes a ring structure and a group that connects the ring structure, and is represented by, for example, general formula (1-1):

[Chem. 59]

-Sp$_1$-(MG$_1$-Sp$_2$)$_n$-MG$_2$-Sp$_3$-  (1-1)

(In the formula, MG$_1$ and MG$_2$ each independently represent at least one ring structure, Sp$_1$, Sp$_2$, and Sp$_3$ each independently represent a single bond or a divalent organic group, in the case where one ring structure can function as a mesogenic group or a mesogenity supporting group, n represents 0 to 5, and in the case where two or more ring structures can function as a mesogenic group or a mesogenity supporting group, n represents 1 to 6.)

In general formula (1-1), examples of MG$_1$ and MG$_2$ each having at least one ring structure include well-known, commonly used structures, and specific examples thereof include the following:

[Chem. 60]

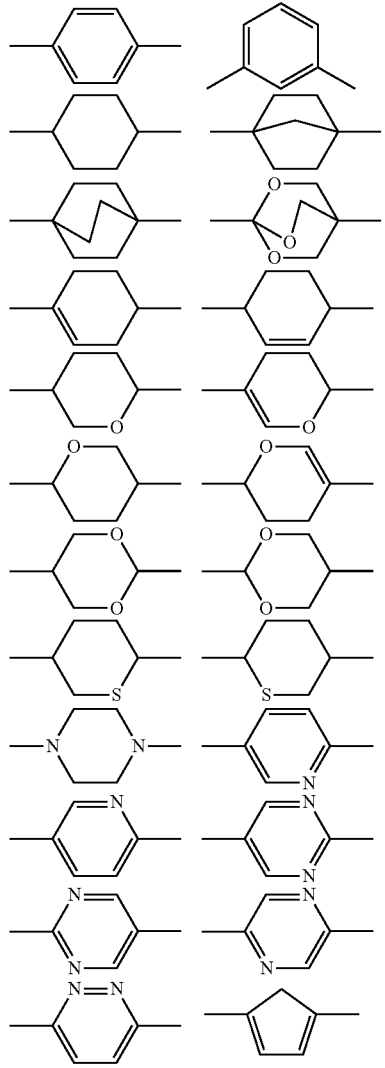

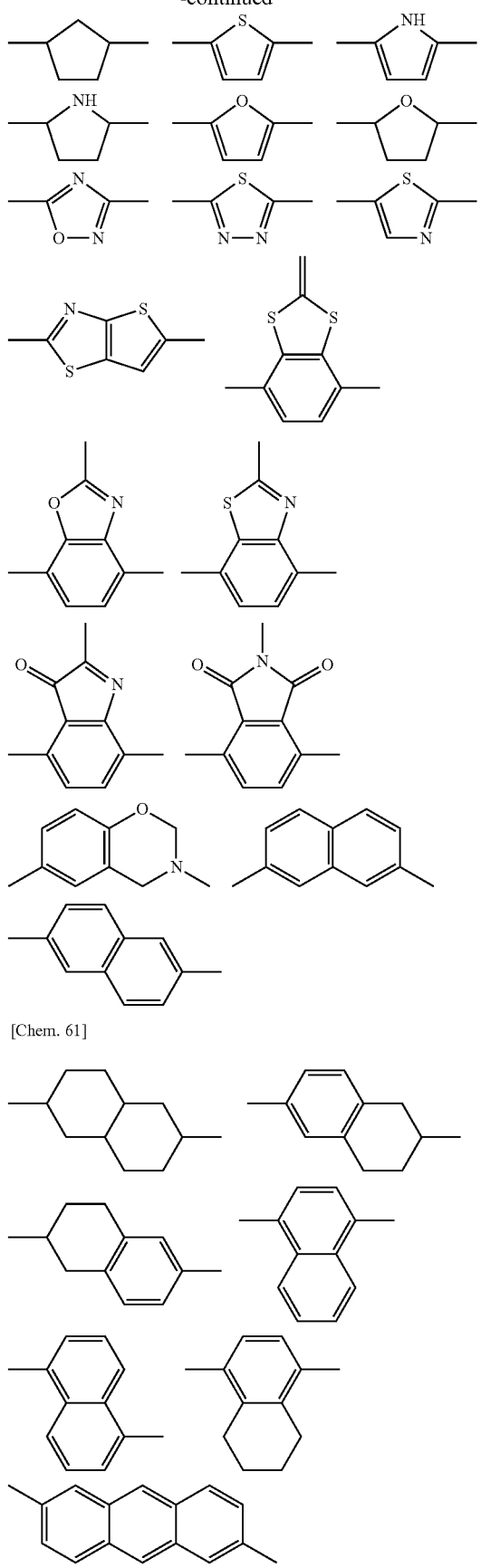

[Chem. 61]

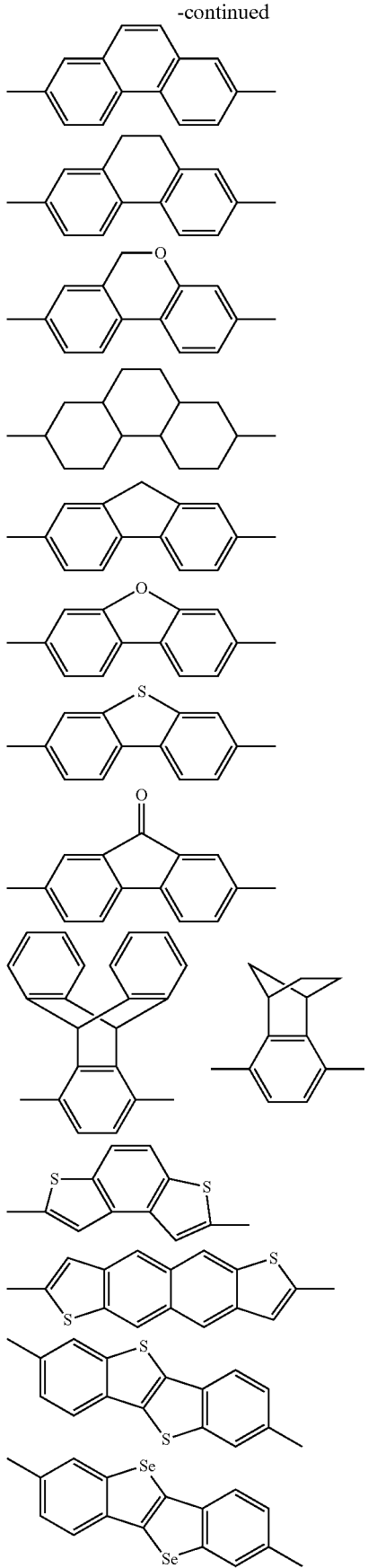

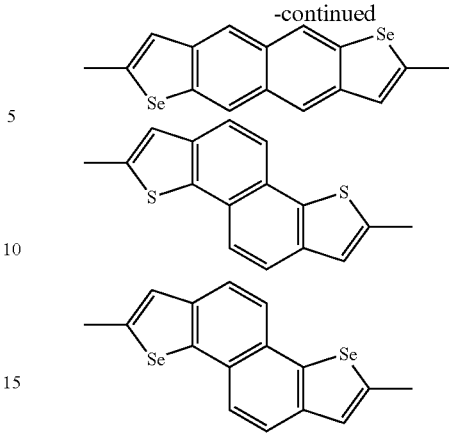

(In the formulae, each structure may have, as at least one substituent, at least one selected from F, Cl, $CF_3$, $OCF_3$, a CN group, alkyl groups each having 1 to 8 carbon atoms, alkoxy groups each having 1 to 8 carbon atoms, alkanoyl groups each having 1 to 8 carbon atoms, alkanoyloxy groups each having 1 to 8 carbon atoms, alkenyl groups each having 2 to 8 carbon atoms, alkenyloxy groups each having 2 to 8 carbon atoms, alkenoyl groups each having 2 to 8 carbon atoms, alkenoyloxy groups each having 2 to 8 carbon atoms, and general formula (1-a):

[Chem. 62]

$$-(Sp)_m\text{-}P \qquad (1\text{-}a)$$

(where P represents a polymerizable functional group, Sp represents a spacer group having 0 to 18 carbon atoms, and m represents 0 or 1).)

In general formula (1-1), $Sp_1$, $Sp_2$, and $Sp_3$ are each preferably, for example, a single bond or a divalent organic group such as —COO—, —OCO—, —COS—, —SCO—, —OCOO—, —$CH_2CH_2$—, —$OCH_2$—, —$CH_2O$—, —$OCF_2$—, —$CF_2O$—, —CH=CH—, —CH=N—, —CF=CF—, —N=N—, —C=N—N=C—, —C≡C—, —CH=CHCOO—, —OCOCH=CH—, —CH=CHCOS—, —SCOCH=CH—, —$CH_2CH_2$COO—, —$CH_2CH_2$OCO—, —COO$CH_2CH_2$—, —OCO$CH_2CH_2$—, —CONH—, —NHCO—, or an alkylene group which has 2 to 10 carbon atoms and which may have a halogen atom.

More specifically, preferable are compounds represented by general formula (1) wherein Sp represents a single bond or an alkylene group (where the alkylene group may be substituted with at least one selected from halogen atoms and CN, and one $CH_2$ group or two or more non-adjacent $CH_2$ groups present in this group may each be independently substituted with —O—, —S—, —NH—, —N($CH_3$)—, —CO—, —COO—, —OCO—, —OCOO—, —SCO—, —COS—, or —C≡C— in such a manner that oxygen atoms are not directly bonded to each other), and MG is represented by general formula (1-b):

[Chem. 63]

$$-Z0\text{-}(A1\text{-}Z1)_n\text{-}A2\text{-}Z2\text{-}A3\text{-}Z3\text{-} \qquad (1\text{-}b)$$

(where A1, A2, and A3 each independently represent a 1,4-phenylene group, a 1,4-cyclohexylene group, a 1,4-cyclohexenyl group, a tetrahydropyran-2,5-diyl group, a 1,3-dioxane-2,5-diyl group, a tetrahydrothiopyran-2,5-diyl group, a 1,4-bicyclo[2.2.2]octylene group, a decahydronaphthalene-2,6-diyl group, a pyridine-2,5-diyl group, a pyrimidine-2,5-diyl group, a pyrazine-2,5-diyl group, a thiophene-2,5-diyl group, a 1,2,3,4-tetrahydronaphthalene-2,6-diyl group, a 2,6-naphthylene group, a phenanthrene-2,7-diyl group, a 9,10-dihydrophenanthrene-2,7-diyl group, a 1,2,3,4,4a,9,10a-octahydrophenanthrene-2,7-diyl group, a 1,4-naphthylene group, a benzo[1,2-b:4,5-b']dithiophene-2,6-diyl group, a benzo[1,2-b:4,5-b']diselenophene-2,6-diyl group, a [1]benzothieno[3,2-b]thiophene-2,7-diyl group, a [1]benzoselenopheno[3,2-b]selenophene-2,7-diyl group, or a fluorene-2,7-diyl group, and may have, as at least one substituent, at least one selected from F, Cl, CF$_3$, OCF$_3$, a CN group, alkyl groups each having 1 to 8 carbon atoms, alkoxy groups each having 1 to 8 carbon atoms, alkanoyl groups each having 1 to 8 carbon atoms, alkanoyloxy groups each having 1 to 8 carbon atoms, alkenyl groups each having 2 to 8 carbon atoms, alkenyloxy groups each having 2 to 8 carbon atoms, alkenoyl groups each having 2 to 8 carbon atoms, and alkenoyloxy groups each having 2 to 8 carbon atoms; Z0, Z1, Z2, and Z3 each independently represent —COO—, —OCO—, —CH$_2$CH$_2$—, —OCH$_2$—, —CH$_2$O—, —CH=CH—, —C≡C—, —CH=CHCOO—, —OCOCH=CH—, —CH$_2$CH$_2$COO—, —CH$_2$CH$_2$OCO—, —COOCH$_2$CH$_2$—, —OCOCH$_2$CH$_2$—, —CONH—, —NHCO—, an alkylene group which has 2 to 10 carbon atoms and which may have a halogen atom, or a single bond; and n represents 0, 1, or 2.)

The polymerizable functional group is preferably any of an acrylic group, a (meth)acrylic group, an acrylamide group, a vinyl group, a vinyl ether group, a glycidyl group, a glycidyl ether group, an oxetanyl group, an oxetanyl ether group, a maleimide group, a maleimide carboxyl group, a thiol group, etc. represented by general formulae (P-1) to (P-18):

[Chem. 64]

(P-1)

(P-2)

(P-3)

(P-4)

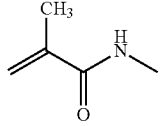
(P-5)

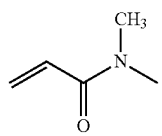
(P-6)

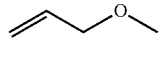
(P-7)

(P-8)

(P-9)

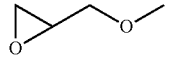
(P-10)

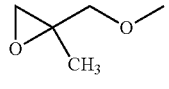
(P-11)

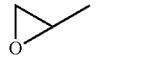
(P-12)

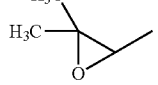
(P-13)

(P-14)

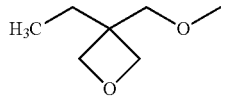
(P-15)

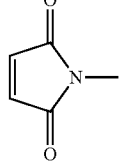
(P-16)

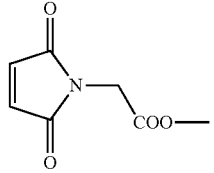
(P-17)

—SH
(P-18)

From the standpoint of productivity, a vinyl ether group, an acrylic group, a (meth)acrylic group, a glycidyl group, and a glycidyl ether group are particularly preferable.

Furthermore, the liquid crystal compound having two or more polymerizable functional groups is preferably a compound selected from the compound group represented by general formulae (2a) and (2b):

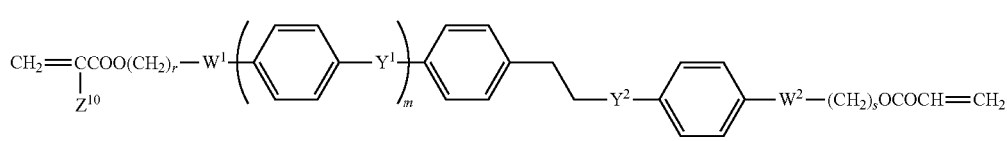

(2a)

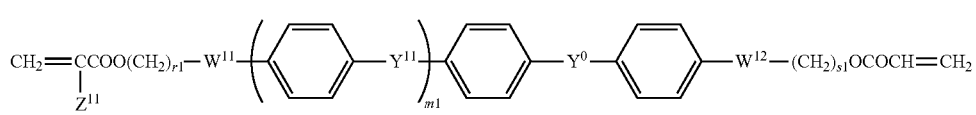

(2b)

(In the formulae, $Z^{10}$ and $Z^{11}$ each independently represent a hydrogen atom or a methyl group; m and m1 represent 0 or 1; $W^1$, $W^{11}$, $W^2$, and $W^{12}$ each independently represent a single bond, —O—, —COO—, or —OCO—; $Y^0$, $Y^1$, $Y^2$, and $Y^{11}$ each independently represent —COO— or —OCO—; r, r1, s, and s1 each independently represent an integer of 2 to 18; and a 1,4-phenylene group present in the formulae may be substituted with at least one selected from alkyl groups each having 1 to 7 carbon atoms, alkoxy groups each having 1 to 7 carbon atoms, alkanoyl groups each having 1 to 7 carbon atoms, a cyano group, and halogen atoms.)

Exemplary compounds are shown below but are not limited thereto.

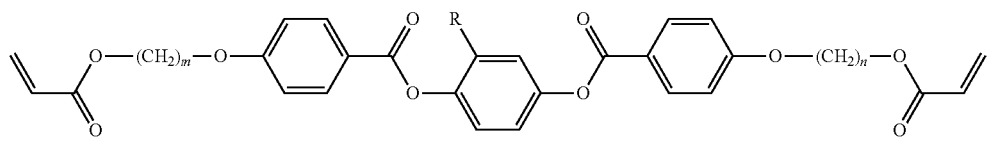

(b-1)

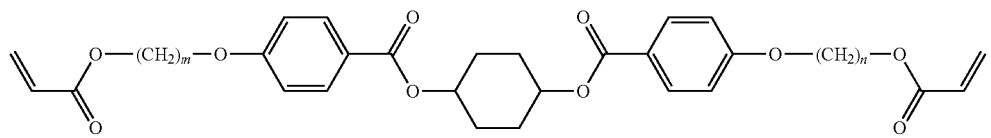

(b-2)

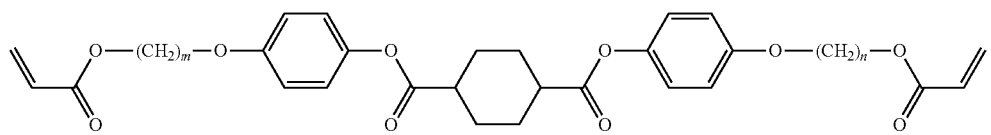

(b-3)

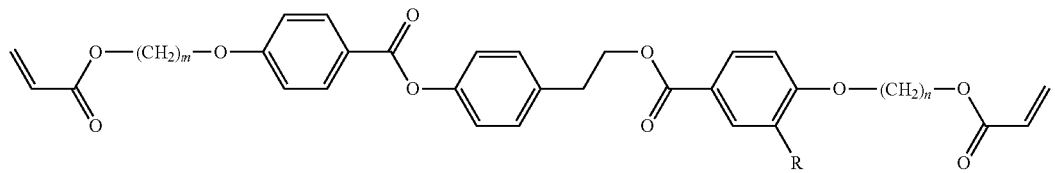

(b-4)

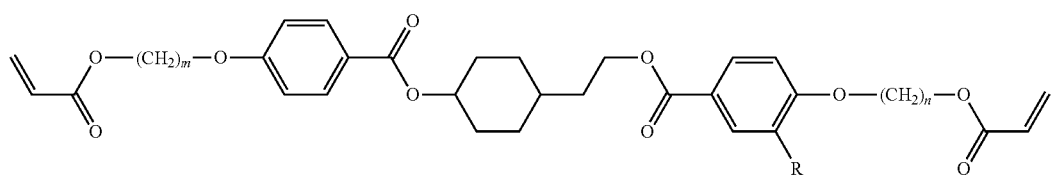

(b-5)

-continued
[Chem. 72]
(b-6)
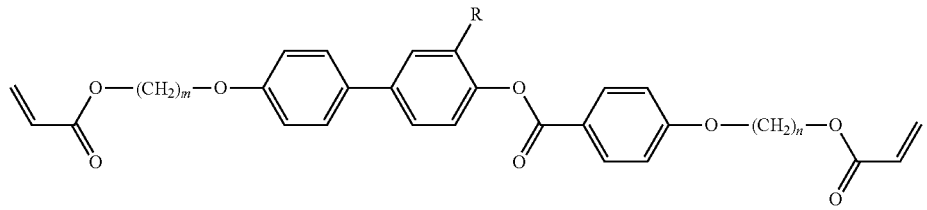
[Chem. 73]
(b-7)
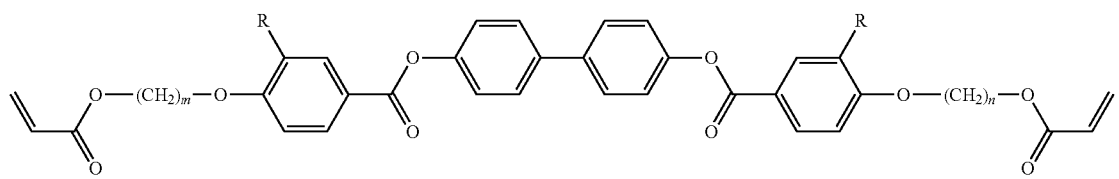
[Chem. 74]
(b-8)
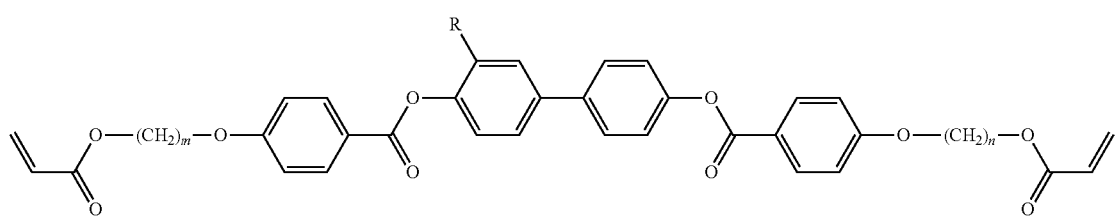
[Chem. 75]
(b-9)
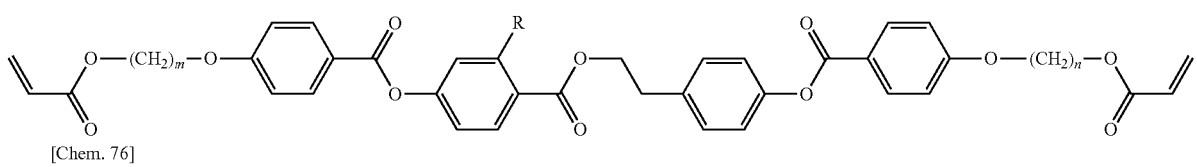
[Chem. 76]
(b-10)
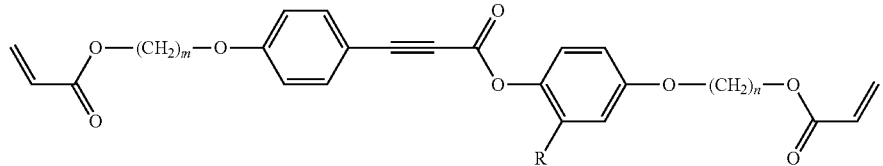
[Chem. 77]
(b-11)
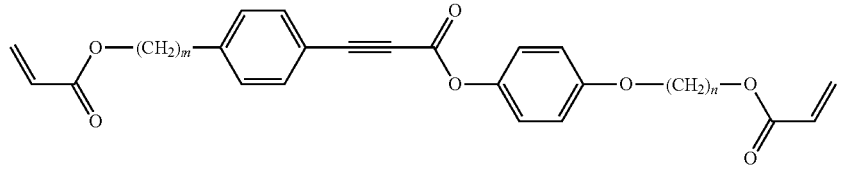
[Chem. 78]
(b-12)
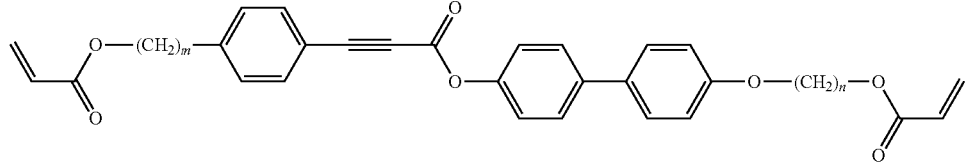

-continued
(b-13)
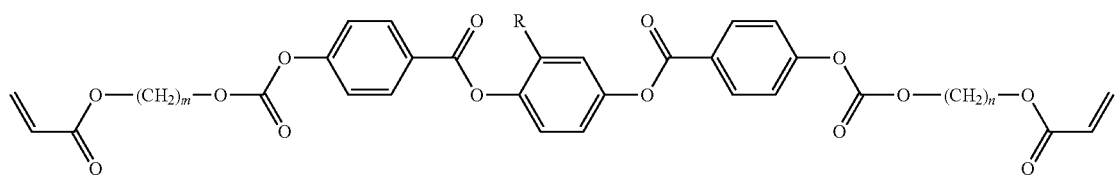
(b-14)
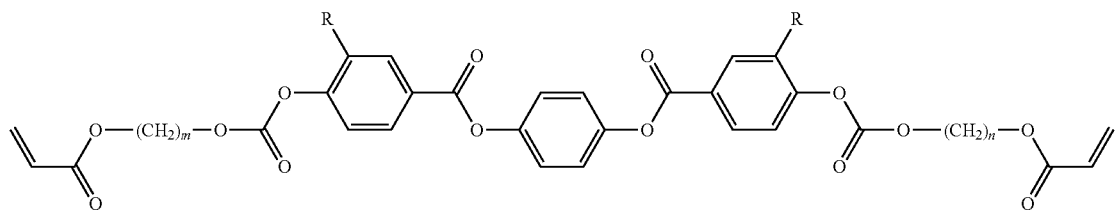
(b-15)
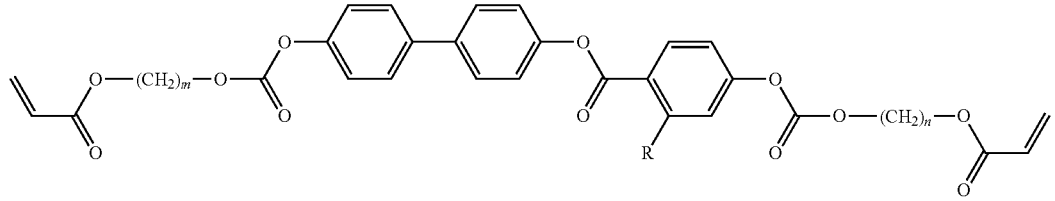
(b-16)
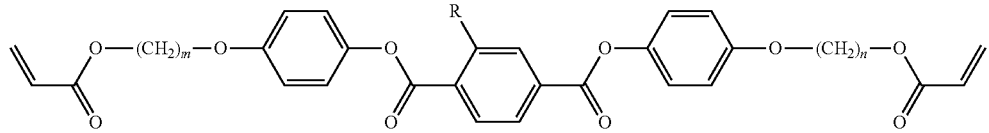
(b-17)
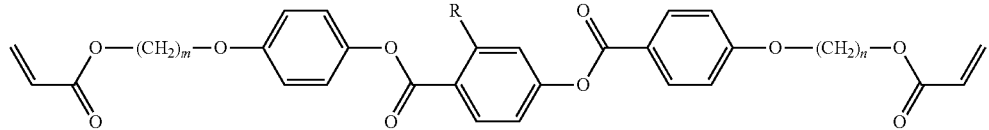
(b-18)
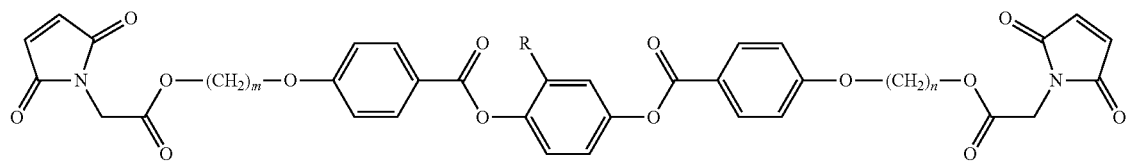
(b-19)
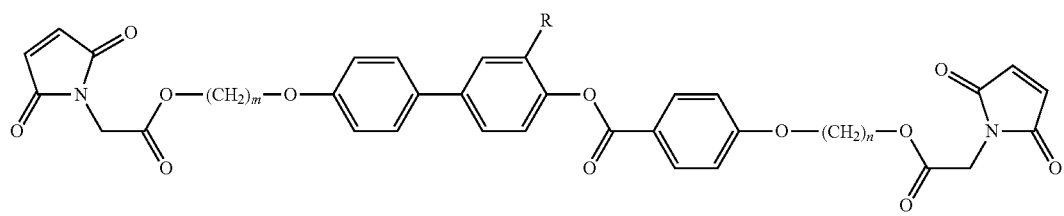

(In the formulae, m and n each independently represent an integer of 1 to 18; and R represents a hydrogen atom, a halogen atom, an alkyl group having 1 to 6 carbon atoms, an alkoxy group having 1 to 6 carbon atoms, or a cyano group. In the case where any of these groups is an alkyl group having 1 to 6 carbon atoms or an alkoxy group having 1 to 6 carbon atoms, the group may be unsubstituted or substituted with one or two or more halogen atoms.) These liquid crystal compounds may be used alone or in combination of two or more compounds.

c) (Polymerization Initiator)

In the birefringent lens material for a stereoscopic image display of the present invention, a polymerization initiator may be used in order to polymerize a liquid crystal compound having a polymerizable functional group. As a photopolymerization initiator used when polymerization is conducted by light irradiation, well-known, commonly used photopolymerization initiators can be used.

Examples of the photopolymerization initiator include 2-hydroxy-2-methyl-1-phenylpropan-1-one ("DAROCUR 1173" manufactured by Merck & Co., Inc.), 1-hydroxycyclohexyl phenyl ketone ("IRGACURE 184" manufactured by BASF), 1-(4-isopropylphenyl)-2-hydroxy-2-methylpropan-1-one ("DAROCUR 1116" manufactured by Merck & Co., Inc.), 2-methyl-1-[(methylthio)phenyl]-2-morpholino propane-1 ("IRGACURE 907" manufactured by BASF), benzyl methyl ketal ("IRGACURE 651" manufactured by BASF), 2-benzyl-2-dimethylamino-1-(4-morpholinophenyl)-butanone ("IRGACURE 369" manufactured by BASF), 2-dimethylamino-2-(4-methylbenzyl)-1-(4-morpholin-4-yl-phenyl)butan-1-one ("IRGACURE 379" manufactured by BASF), 2,2-dimethoxy-1,2-diphenylethan-1-one, bis(2,4,6-trimethylbenzoyl)-phenylphosphine oxide (DAROCUR TPO), 2,4,6-trimethylbenzoyl-diphenylphosphine oxide ("IRGACURE 819" manufactured by BASF), 1,2-octanedione, 1-[4-(phenylthio)-,2-(O-benzoyloxime)] ("IRGACURE OXE01" manufactured by BASF), ethanone, 1-[9-ethyl-6-(2-methylbenzoyl)-9H-carbazol-3-yl]-,1-(O-acetyloxime) ("IRGACURE OXE02" manufactured by BASF), a mixture of 2,4-diethylthioxanthone ("KAYACURE DETX" manufactured by Nippon Kayaku Co., Ltd.) and ethyl p-dimethylamino benzoate ("KAYACURE EPA" manufactured by Nippon Kayaku Co., Ltd.), a mixture of isopropylthioxanthone ("QUANTACURE ITX" manufactured by Ward Blenkinsop Co., Ltd.) and ethyl p-dimethylamino benzoate, and acylphosphine oxide ("Lucirin TPO" manufactured by BASF). The amount of photopolymerization initiator used is preferably 0.1% to 10% by mass, and particularly preferably 0.5% to 5% by mass relative to the birefringent lens material for a stereoscopic image display. These may be used alone or in combination of two or more photopolymerization initiators.

As a thermal polymerization initiator used in the case of thermal polymerization, well-known, commonly used thermal polymerization initiators can be used. Examples of the thermal polymerization initiator that can be used include organic peroxides such as methyl acetoacetate peroxide, cumene hydroperoxide, benzoyl peroxide, bis(4-t-butylcyclohexyl)peroxy dicarbonate, t-butylperoxy benzoate, methyl ethyl ketone peroxide, 1,1-bis(t-hexylperoxy)3,3,5-trimethylcyclohexane, p-pentahydroperoxide, t-butyl hydroperoxide, dicumyl peroxide, isobutyl peroxide, di(3-methyl-3-methoxybutyl)peroxy dicarbonate, and 1,1-bis(t-butylperoxy)cyclohexane; azonitrile compounds such as 2,2'-azobisisobutyronitrile and 2,2'-azobis(2,4-dimethyl valeronitrile; azoamidine compounds such as 2,2'-azobis(2-methyl-N-phenylpropione-amidine)dihydrochloride; azoamide compounds such as 2,2'-azobis{2-methyl-N-[1,1-bis(hydroxymethyl)-2-hydroxyethyl]propioneamide}; and alkylazo compounds such as 2,2'-azobis(2,4,4-trimethylpentane). The amount of thermal polymerization initiator used is preferably 0.1% to 10% by mass, and particularly preferably 0.5% to 5% by mass relative to the birefringent lens material for a stereoscopic image display. These may be used alone or in combination of two or more thermal polymerization initiators. These thermal polymerization initiators may be used in combination with photopolymerization initiators.

d) (Polymerization Inhibitor)

In the birefringent lens material for a stereoscopic image display of the present invention, a polymerization inhibitor may be used in order to stably produce or stably store the birefringent lens material. Examples of the polymerization inhibitor include phenolic compounds, quinone compounds, amine compounds, thioether compounds, and nitroso compounds.

Examples of the phenolic compound include p-methoxyphenol, cresol, t-butyl catechol, 3,5-di-t-butyl-4-hydroxytoluene, 2,2'-methylenebis(4-methyl-6-t-butylphenol), 2,2'-methylenebis(4-ethyl-6-t-butylphenol), 4,4'-thiobis(3-methyl-6-t-butylphenol), 4-methoxy-1-naphthol, and 4,4'-dialkoxy-2,2'-bi-1-naphthol.

Examples of the quinone compound include hydroquinone, methylhydroquinone, tert-butyl hydroquinone, p-benzoquinone, methyl-p-benzoquinone, tert-butyl-p-benzoquinone, 2,5-diphenylbenzoquinone, 2-hydroxy-1,4-naphthoquinone, 1,4-naphthoquinone, 2,3-dichloro-1,4-naphthoquinone, anthraquinone, and diphenoquinone.

Examples of the amine compound include p-phenylenediamine, 4-aminodiphenylamine, N,N'-diphenyl-p-phenylenediamine, N-i-propyl-N'-phenyl-p-phenylenediamine, N-(1,3-dimethylbutyl)-N'-phenyl-p-phenylenediamine, N,N'-di-2-naphthyl-p-phenylenediamine, diphenylamine, N-phenyl-β-naphthylamine, 4,4'-dicumyl-diphenylamine, and 4,4'-dioctyl-diphenylamine.

Examples of the thioether compound include phenothiazine and distearyl thiodipropionate.

Examples of the nitroso compound include N-nitrosodiphenylamine, N-nitrosophenylnaphthylamine, N-nitrosodinaphthylamine, p-nitrosophenol, nitrosobenzene, p-nitrosodiphenylamine, α-nitroso-β-naphthol etc., N,N-dimethyl-p-nitrosoaniline, p-nitrosodiphenylamine, p-nitrosodimethylamine, p-nitroso-N,N-diethylamine, N-nitrosoethanolamine, N-nitrosodi-n-butylamine, N-nitroso-N-n-butyl-4-butanolamine, N-nitroso-diisopropanolamine, N-nitroso-N-ethyl-4-butanolamine, 5-nitroso-8-hydroxyquinoline, N-nitrosomorpholine, N-nitroso-N-phenylhydroxylamine ammonium salt, nitrosobenzene, 2,4,6-tri-tert-butylnitrosobenzene, N-nitroso-N-methyl-p-toluenesulfonamide, N-nitroso-N-ethylurethane, N-nitroso-N-n-propylurethane, 1-nitroso-2-naphthol, 2-nitroso-1-naphthol, sodium 1-nitroso-2-naphthol-3,6-sulfonate, sodium 2-nitroso-1-naphthol-4-sulfonate, 2-nitroso-5-methylaminophenol hydrochloride, and 2-nitroso-5-methylaminophenol hydrochloride.

e) (Stabilizer)

In the birefringent lens material for a stereoscopic image display of the present invention, a general-purpose stabilizer may be used for the purpose of obtaining a coating film having a uniform thickness or for any other purposes. For example, additives such as a leveling agent, a thixotropic agent, a surfactant, an ultraviolet absorber, an infrared absorber, an antioxidant, and a surface treatment agent may be added to the extent that the liquid-crystal alignment capability is not significantly decreased.

f) (Solvent)

In the birefringent lens material for a stereoscopic image display of the present invention, no solvent is usually used. However, a solvent may be used in order to uniformly apply the birefringent lens material. The solvent used is not particularly limited as long as a substrate or an alignment layer formed on the substrate is not dissoluted when the birefringent lens material is applied onto the substrate and a polymerizable liquid crystal composition of the present invention can be aligned without defects. Solvents in which the polymerizable liquid crystal compound exhibits good solubility are preferred. Examples of such a solvent include aromatic hydrocarbons such as toluene, xylene, cumene, and mesitylene; ester solvents such as methyl acetate, ethyl acetate, propyl acetate, and butyl acetate; ketone solvents such as methyl ethyl ketone, methyl isobutyl ketone, and cyclohexanone; ether solvents such as tetrahydrofuran, 1,2-dimethoxyethane, and anisole; amide solvents such as N,N-dimethylformamide and N-methyl-2-pyrrolidone; propylene glycol monomethyl ether acetate; diethylene glycol monomethyl ether acetate; γ-butyrolactone; and chlorobenzene. These may be used alone or in combination of two or more solvents.

g) (Surfactant or Polymer that Promotes Homogeneous Alignment)

In the birefringent lens material for a stereoscopic image display of the present invention, a surfactant or polymer that promotes homogeneous alignment is used, as required, in the case where the state of homogeneous alignment is temporarily achieved by simply applying the birefringent lens material in a process of producing a birefringent lens for a stereoscopic image display.

The surfactant used is not particularly limited, but preferably a surfactant having a surface tension lower than that of a liquid crystal compound having a polymerizable functional group. Examples of such a surfactant include fluorine-containing nonionic surfactants, organosilane surfactants, and polyacrylate surfactants. The surfactants may have a polymerizable group so that a stronger film is formed when polymerization is conducted.

The polymer used is not particularly limited, but preferably a polymer having a surface tension lower than that of a liquid crystal compound having a polymerizable functional group. Examples of such a polymer include polyethylene, polypropylene, polyisobutylene, paraffin, liquid paraffin, chlorinated polypropylene, chlorinated paraffin, chlorinated liquid paraffin, and polyvinylidene fluoride.

The weight-average molecular weight of the polymer is preferably 200 to 1,000,000, more preferably 300 to 100,000, and particularly preferably 400 to 10,000.

(Method for Producing Birefringent Lens for Stereoscopic Image Display)

(Substrate)

A substrate used in a birefringent lens for a stereoscopic image display of the present invention is a substrate that is usually used in liquid crystal devices, displays, optical components, and optical films, and is not particularly limited as long as the substrate has heat resistance that can withstand heating after the birefringent lens material for a stereoscopic image display of the present invention is applied or during the production of a liquid crystal device. Examples of the substrate include glass substrates, metal substrates, ceramic substrates, and plastic substrates. In particular, in the case where the substrate is composed of an organic material, examples of the organic material include cellulose derivatives, polyolefins, polyesters, polycarbonates, polyacrylates, polyarylates, polyethersulfones, polyimides, polyphenylene sulfides, polyphenylene ethers, nylons, and polystyrenes. Among these, polyesters, polystyrenes, polyolefins, cellulose derivatives, polyarylates, and polycarbonates are preferable.

The substrate is usually subjected to an alignment treatment or an alignment layer may be provided on the substrate so that the birefringent lens material for a stereoscopic image display of the present invention is aligned when the birefringent lens material for a stereoscopic image display is applied onto the substrate. Examples of the alignment treatment include a stretching treatment, a rubbing treatment, a polarized ultraviolet-visible light irradiation treatment, and an ion-beam treatment. In the case where an alignment layer is used, well-known, commonly used alignment layers are used. Examples of the material of the alignment layer include compounds such as polyimides, polysiloxanes, polyamides, polyvinyl alcohols, polycarbonates, polystyrenes, polyphenylene ethers, polyarylates, polyethylene terephthalates, polyethersulfones, epoxy resins, epoxy acrylate resins, acrylic resins, coumarin compounds, chalcon compounds, cinnamate compounds, fulgide compounds, anthraquinone compounds, azo compounds, and arylethene compounds. Compounds that are subjected to an alignment treatment by rubbing are preferably materials, the crystallization of which is accelerated by the alignment treatment or by performing a heating step after the alignment treatment. Among compounds that are subjected to an alignment treatment other than rubbing, photo-alignment materials are preferably used.

(Coating)

As a coating method for obtaining a birefringent lens for a stereoscopic image display of the present invention, well-known, commonly used methods such as an applicator method, a bar coating method, a spin coating method, a gravure printing method, a flexographic printing method, an ink-jet method, a die coating method, a cap coating method, and dipping can be employed. In the case where a birefringent lens material for a stereoscopic image display, the material being diluted with a solvent, is applied, the birefringent lens material is dried after the application.

(Lens-Shaping Step)

Shaping of the birefringent lens for a stereoscopic image display of the present invention is performed by polymerizing a birefringent lens material for a stereoscopic image display in the form of a lens by using a photomask or covering a coating film of a birefringent lens material for a stereoscopic image display with a lens-shaped resin mold.

In the case where a photomask is used, a photomask that has a pattern designed so that when the birefringent lens material for a stereoscopic image display is polymerized, the resulting polymerized material has a desired lens shape is used. In the case where a resin mold is used, a coating film of a birefringent lens material for a stereoscopic image display is covered with a concave lens-shaped resin mold having a refractive index equal to an ordinary refractive index (no) of the birefringent lens material for a stereoscopic image display of the present invention, and polymerization is conducted in this covered state. Alternatively, in the case where the resin mold is once detached, a resin used in the resin mold is applied onto the coating film of the birefringent lens material for a stereoscopic image display, the coating film having been taken from the resin mold, and polymerization is then conducted.

(Polymerization Step)

A polymerization operation of the birefringent lens material for a stereoscopic image display of the present invention is generally performed by irradiation with light such as ultraviolet light or by heating after the birefringent lens material for a stereoscopic image display is applied and the resulting coating film is formed into a lens shape. When the polymerization is conducted by light irradiation, specifically, the birefringent lens material is irradiated with preferably ultraviolet light having a wavelength of 390 nm or less, and most preferably light having a wavelength of 250 to 370 nm. However, in the case where the polymerizable liquid crystal composition is, for example, decomposed by ultraviolet light having a wavelength of 390 nm or less, in some cases, it is preferable to conduct the polymerization treatment with ultraviolet light having a wavelength of 390 nm or more. This light is preferably diffused light that is not polarized.

On the other hand, polymerization by heating is preferably conducted at a temperature at which the birefringent lens material for a stereoscopic image display exhibits a liquid-crystalline phase or lower. In particular, when a thermal polymerization initiator that releases radicals as a result of heating is used, it is preferable to use a thermal polymerization initiator, the cleavage temperature of which is within the above temperature range. In the case where a thermal polymerization initiator and a photopolymerization initiator are used in combination, the polymerization temperature and the respective initiators are suitably selected, in addition to the consideration of the limitation of the above temperature range, so that the rates of polymerization of a photo-alignment layer and a polymerizable liquid crystal film are not significantly different from each other. The polymerization is preferably conducted at a temperature lower than a temperature at which heterogeneous polymerization due to heat is induced, though the heating temperature depends on the transition temperature from a liquid-crystalline phase to an isotropic phase of the polymerizable liquid crystal composition. However, when the heating temperature exceeds a glass transition temperature of the substrate composed of an organic material, thermal deformation of the substrate becomes significant. Thus, the heating temperature is preferably in the range of room temperature to the glass transition temperature of the substrate. For example, in the case where the polymerizable group is a (meth)acryloyl group, the polymerization is preferably conducted at a temperature lower than 90° C.

The birefringent lens for a stereoscopic image display may be heat-treated in order to stabilize solvent resistance and heat resistance of the resulting birefringent lens for a stereoscopic image display. In this case, heating is preferably conducted at a glass transition temperature of the birefringent lens for a stereoscopic image display or higher. Usually, the heating is preferably conducted within a range that does not exceed the glass transition temperature of the substrate composed of an organic material. Alternatively, a light irradiation treatment may be performed for the above purpose. In this case, it is preferable to perform the light irradiation treatment to the extent that the liquid crystal compound component in the birefringent lens for a stereoscopic image display is not subjected to photodecomposition by the light irradiation.

Figure 2:
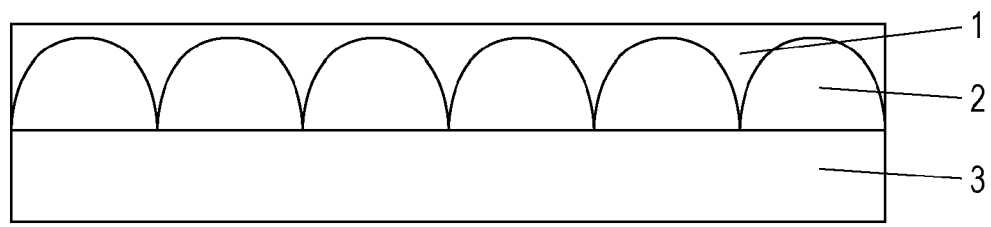
FIG. 2 illustrates a structure of a birefringent lens (including a substrate) for a stereoscopic image display of the present invention.

The prepared birefringent lens for a stereoscopic image display may be used in integration with the substrate in the state where the substrate is left (refer to FIG. 2). Alternatively, the birefringent lens for a stereoscopic image display may be separated from the substrate and used in the state where the lens does not have a substrate (refer to FIG. 1).

EXAMPLES

The present invention will now be described by way of Synthesis Examples, Examples, and Comparative Examples. However, the present invention is not limited thereto. Note that "part" and "%" are on a mass basis unless otherwise specified.

(Preparation of Birefringent Lens Material (1) for Stereoscopic Image Display)

Fifty parts of a liquid crystal compound represented by formula (B-1), 50 parts of a liquid crystal compound represented by formula (B-2), 0.1 parts of DAROCUR TPO (C-1), and 0.1 parts of p-methoxyphenol (D-1) were mixed while heating to prepare a birefringent lens material (1) for a stereoscopic image display of the present invention.

[Chem. 86]

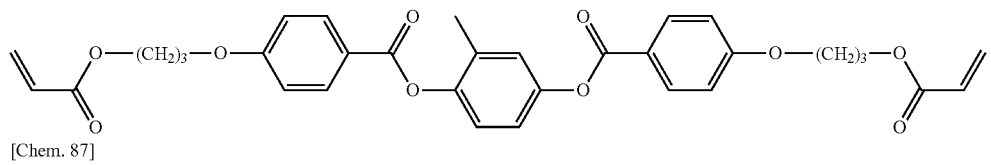

(B-1)

[Chem. 87]

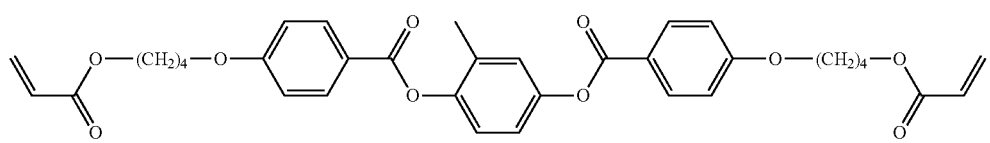

(B-2)

(Preparation of Birefringent Lens Materials (2) to (20) for Stereoscopic Image Display)

Birefringent lens materials (2) to (20) for a stereoscopic image display of the present invention were prepared as in the preparation of the birefringent lens material (1) for a stereoscopic image display of the present invention. Tables 1 to 5 show specific compositions of the birefringent lens materials (1) to (20) for a stereoscopic image display of the present invention.

TABLE 1

|  | (1) | (2) | (3) | (4) | (5) | (6) | (7) | (8) | (9) | (10) |
|---|---|---|---|---|---|---|---|---|---|---|
| Compound (A-1) |  |  | 50 |  |  |  | 20 |  |  | 10 |
| Compound (A-2) |  |  |  | 50 |  |  |  |  |  | 10 |
| Compound (A-3) |  |  |  |  | 20 |  |  | 20 |  | 10 |
| Compound (A-4) |  |  |  |  |  | 20 |  |  | 20 | 15 |
| Compound (A-5) |  |  |  |  |  | 20 |  |  | 20 | 15 |
| Compound (B-1) | 50 | 30 |  |  | 40 | 30 | 20 | 20 | 15 | 10 |
| Compound (B-2) | 50 | 30 |  |  | 40 | 30 | 20 | 20 | 15 | 10 |
| Compound (B-3) |  | 20 | 25 | 25 |  |  | 20 | 20 | 15 | 10 |
| Compound (B-4) |  | 20 | 25 | 25 |  |  | 20 | 20 | 15 | 10 |
| Compound (C-1) | 0.1 | 0.1 | 0.1 | 0.1 | 0.1 | 0.1 | 0.1 | 0.1 | 0.1 | 0.1 |
| Compound (C-2) |  |  |  |  |  |  |  |  |  |  |
| Compound (C-3) |  |  |  |  |  |  |  |  |  |  |
| Compound (D-1) | 0.1 | 0.1 | 0.1 | 0.1 | 0.1 | 0.1 | 0.1 | 0.1 | 0.1 | 0.1 |
| Compound (D-2) |  |  |  |  |  |  |  |  |  |  |
| Compound (E-1) |  |  |  |  |  |  |  |  |  |  |
| Compound (E-2) |  |  |  |  |  |  |  |  |  |  |
| Compound (F-1) |  |  |  |  |  |  |  |  |  |  |

TABLE 2

|  | (11) | (12) | (13) | (14) | (15) | (16) | (17) | (18) | (19) | (20) |
|---|---|---|---|---|---|---|---|---|---|---|
| Compound (A-1) | 15 | 15 | 15 | 10 | 15 |  |  |  |  |  |
| Compound (A-2) |  |  |  |  |  |  |  |  |  |  |
| Compound (A-3) | 15 | 15 | 15 | 15 | 15 |  |  |  |  |  |
| Compound (A-4) | 10 | 10 | 10 | 10 | 10 | 20 |  |  |  |  |
| Compound (A-5) | 10 | 10 | 10 | 10 | 10 | 20 |  |  |  |  |
| Compound (B-1) | 15 | 15 | 15 | 15 | 15 | 20 | 100 |  |  |  |
| Compound (B-2) | 15 | 15 | 15 | 15 | 15 | 20 |  | 100 |  |  |
| Compound (B-3) | 10 | 10 | 10 | 10 | 10 | 10 |  |  | 100 |  |
| Compound (B-4) | 10 | 10 | 10 | 10 | 10 | 10 |  |  |  | 100 |
| Compound (C-1) |  |  |  | 0.1 | 0.1 |  | 0.1 | 0.1 | 0.1 | 0.1 |
| Compound (C-2) | 1 | 1 |  |  |  |  |  |  |  |  |
| Compound (C-3) |  |  | 1 |  |  | 3 |  |  |  |  |
| Compound (D-1) | 0.1 |  | 0.1 | 0.1 | 0.1 | 0.1 | 0.1 | 0.1 | 0.1 | 0.1 |
| Compound (D-2) |  | 0.1 |  |  |  |  |  |  |  |  |
| Compound (E-1) |  |  |  | 5 |  |  |  |  |  |  |
| Compound (E-2) |  |  |  |  | 0.2 |  |  |  |  |  |
| Compound (F-1) |  |  |  |  |  | 150 |  |  |  |  |

[Chem. 88]

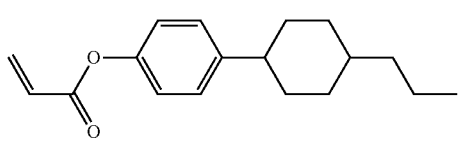

(A-1)

[Chem. 89]

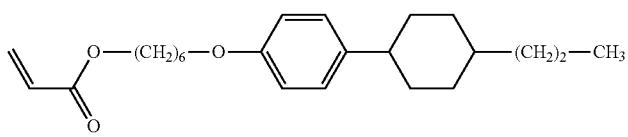

(A-2)

[Chem. 90]

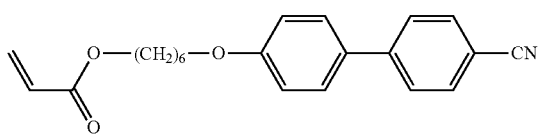

(A-3)

[Chem. 91]

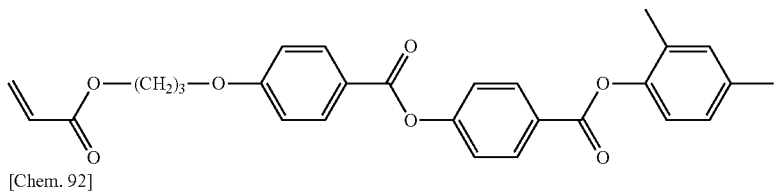

(A-4)

[Chem. 92]

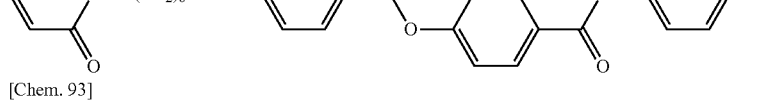

(A-5)

[Chem. 93]

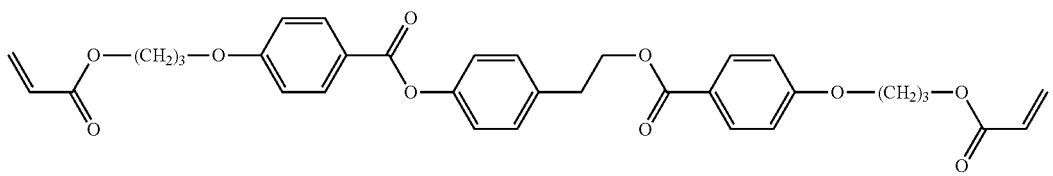

(B-3)

[Chem. 94]

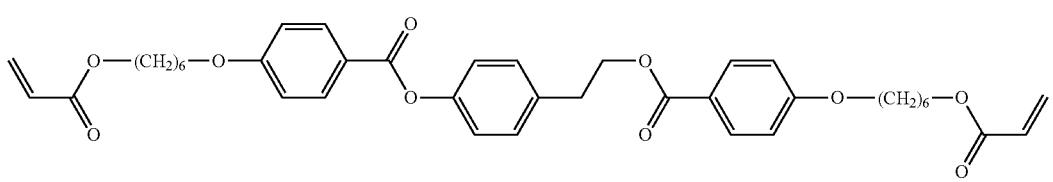

(B-4)

IRGACURE 651 (C-2) (manufactured by BASF)
IRGACURE 907 (C-3) (manufactured by BASF)
Quino Power LSN (D-2) (manufactured by Kawasaki Kasei Chemicals Ltd.)
Butyl acrylate (E-1) (manufactured by Toagosei Co., Ltd.)
IRGANOX 1076 (E-2) (manufactured by BASF)
Cyclopentanone (F-1)

Example 1

A polyimide solution for an alignment layer was applied onto a glass substrate having a thickness of 0.7 mm by a spin coating method. The polyimide solution was dried at 100° C. for 10 minutes and then baked at 200° C. for 60 minutes to obtain a coating film. The coating film was subjected to a rubbing treatment. The rubbing treatment was conducted using a commercially available rubbing device.

The birefringent lens material (1) for a stereoscopic image display of the present invention was applied onto the rubbed substrate by a spin coating method in the state where the birefringent lens material (1) was heated at 80° C. Another substrate that had been subjected to a rubbing treatment was arranged on the resulting coating film so that the rubbing direction of the other substrate is antiparallel to the above-described substrate, and the resulting product was then cooled to room temperature. Subsequently, the product was irradiated with UV light at an intensity of 40 mW/cm² for 25 seconds using a high-pressure mercury-vapor lamp. The cured coating film was then separated from the rubbed substrates, thus obtaining a cured product of the birefringent lens material for a stereoscopic image display of the present invention. The cured product had a film thickness of 50 μm, an ordinary refractive index no of 1.537, an extraordinary refractive index ne of 1.701, and a Δn of 0.165. The alignment of the cured product was also good. The transition temperature from a solid phase to a liquid-crystalline phase was −21° C., and the transition temperature from a liquid-crystalline phase to a liquid phase was 121° C.

Examples 2 to 14

Cured products of the birefringent lens materials for a stereoscopic image display of the invention in Examples 2 to 14 were obtained as in Example 1. Each of the cured products had a film thickness of 50 μm, and the alignment thereof was good. The obtained results are shown in Table 3.

Each of the birefringent lens materials for a stereoscopic image display of the present invention can be polymerized at room temperature, has a good alignment property, and is good in terms of productivity.

TABLE 3

|  | Birefringent lens material for stereoscopic image display | Coating temperature (° C.) | Alignment at room temperature | ne | no | Δn | Transition temperature (solid/liquid crystal) | Transition temperature (liquid crystal/liquid) |
|---|---|---|---|---|---|---|---|---|
| Example 1 | Birefringent lens material (1) for stereoscopic image display | 80 | Good | 1.701 | 1.537 | 0.164 | −21° C. | 121° C. |
| Example 2 | Birefringent lens material (2) for stereoscopic image display | 70 | Good | 1.695 | 1.533 | 0.162 | −25° C. | 95° C. |
| Example 3 | Birefringent lens material (3) for stereoscopic image display | 40 | Good | 1.595 | 1.543 | 0.052 | −30° C. | 53° C. |
| Example 4 | Birefringent lens material (4) for stereoscopic image display | 40 | Good | 1.646 | 1.544 | 0.102 | −31° C. | 52° C. |
| Example 5 | Birefringent lens material (5) for stereoscopic image display | 70 | Good | 1.699 | 1.531 | 0.168 | −25° C. | 90° C. |
| Example 6 | Birefringent lens material (6) for stereoscopic image display | 70 | Good | 1.694 | 1.526 | 0.168 | −21° C. | 125° C. |
| Example 7 | Birefringent lens material (7) for stereoscopic image display | 70 | Good | 1.672 | 1.535 | 0.137 | −21° C. | 86° C. |
| Example 8 | Birefringent lens material (8) for stereoscopic image display | 70 | Good | 1.697 | 1.531 | 0.166 | −28° C. | 75° C. |
| Example 9 | Birefringent lens material (9) for stereoscopic image display | 70 | Good | 1.701 | 1.533 | 0.168 | −26° C. | 98° C. |
| Example 10 | Birefringent lens material (10) for stereoscopic image display | 70 | Good | 1.676 | 1.531 | 0.145 | −29° C. | 80° C. |
| Example 11 | Birefringent lens material (11) for stereoscopic image display | 70 | Good | 1.689 | 1.533 | 0.156 | −28° C. | 85° C. |
| Example 12 | Birefringent lens material (12) for stereoscopic image display | 70 | Good | 1.689 | 1.533 | 0.156 | −28° C. | 85° C. |
| Example 13 | Birefringent lens material (13) for stereoscopic image display | 70 | Good | 1.689 | 1.533 | 0.156 | −28° C. | 85° C. |
| Example 14 | Birefringent lens material (14) for stereoscopic image display | 70 | Good | 1.689 | 1.533 | 0.156 | −27° C. | 70° C. |

Comparative Examples 1 to 4

Cured products of the birefringent lens materials for a stereoscopic image display in Comparative Examples 1 to 4 were obtained as in Example 1. In each of the cured products, crystallization significantly occurred when polymerization was conducted at room temperature, and a large number of alignment defects were observed. The obtained results are shown in Table 4.

TABLE 4

|  | Birefringent lens material for stereoscopic image display | Coating temperature (° C.) | Alignment at room temperature | ne | no | Δn | Transition temperature (solid/liquid crystal) | Transition temperature (liquid crystal/liquid) |
|---|---|---|---|---|---|---|---|---|
| Comparative Example 1 | Birefringent lens material (17) for stereoscopic image display | 80 | Defects were observed | 1.707 | 1.533 | 0.174 | 69° C. | 128° C. |
| Comparative Example 2 | Birefringent lens material (18) for stereoscopic image display | 80 | Defects were observed | 1.700 | 1.530 | 0.170 | 63° C. | 124° C. |
| Comparative Example 3 | Birefringent lens material (19) for stereoscopic image display | 80 | Defects were observed | — | — | — | — | 67° C. |
| Comparative Example 4 | Birefringent lens material (20) for stereoscopic image display | 80 | Defects were observed | 1.670 | 1.527 | 0.143 | 63° C. | 81° C. |

Example 15

A polyimide solution for an alignment layer was applied onto a glass substrate having a thickness of 0.7 mm by a spin coating method. The polyimide solution was dried at 100° C. for 10 minutes and then baked at 200° C. for 60 minutes to obtain a coating film. The coating film was subjected to a rubbing treatment. The rubbing treatment was conducted using a commercially available rubbing device.

The birefringent lens material (15) for a stereoscopic image display of the present invention was applied onto the rubbed substrate 3 by a spin coating method in the state where the birefringent lens material (15) was heated at 70° C. A resin mold 1 that had been subjected to an alignment treatment was arranged on the resulting coating film so that an alignment direction of the rubbed substrate was parallel to an alignment direction of the resin mold 1, and the resulting product was then cooled to room temperature. Subsequently, the product was irradiated with ultraviolet light at an intensity of 40 mW/cm$^2$ for 25 seconds using a high-pressure mercury-vapor lamp. Thus, a birefringent lens for a stereoscopic image display was obtained. The substrate 3 was detached from the obtained lens to produce a birefringent lens for a stereoscopic image display illustrated in FIG. 1. The obtained birefringent lens for a stereoscopic image display of the present invention had no defect, and the alignment of the birefringent lens was also good. The birefringent lens material (15) for a stereoscopic image display of the present invention had a transition temperature from a solid phase to a liquid-crystalline phase of −25° C. and a transition temperature from a liquid-crystalline phase to a liquid phase of 87° C.

Example 16

A polyimide solution for an alignment layer was applied onto a glass substrate having a thickness of 0.7 mm by a spin coating method. The polyimide solution was dried at 100° C. for 10 minutes and then baked at 200° C. for 60 minutes to obtain a coating film. The coating film was subjected to a rubbing treatment. The rubbing treatment was conducted using a commercially available rubbing device.

The birefringent lens material (15) for a stereoscopic image display of the present invention was applied onto the rubbed substrate 3 by a spin coating method in the state where the birefringent lens material (15) was heated at 70° C. A resin mold 1 that had been subjected to an alignment treatment was arranged on the resulting coating film so that an alignment direction of the rubbed substrate was parallel to an alignment direction of the resin mold 1, and the resulting product was then cooled to room temperature. Next, the resin mold 1 was slowly detached, and an ultraviolet-curable epoxy acrylate resin was applied onto the coating film by a spin coating method. Subsequently, the resulting product was irradiated with ultraviolet light at an intensity of 40 mW/cm$^2$ for 25 seconds using a high-pressure mercury-vapor lamp. Thus, a birefringent lens for a stereoscopic image display illustrated in FIG. 2 was obtained. The obtained birefringent lens for a stereoscopic image display of the present invention had no defect, and the alignment of the birefringent lens was also good.

Example 17

A polyimide solution for an alignment layer was applied onto a glass substrate having a thickness of 0.7 mm by a spin coating method. The polyimide solution was dried at 100° C. for 10 minutes and then baked at 200° C. for 60 minutes to obtain a coating film. The coating film was subjected to a rubbing treatment. The rubbing treatment was conducted using a commercially available rubbing device.

Next, 0.2 parts of liquid paraffin was added to 100 parts of the birefringent lens material (16) for a stereoscopic image display, and the mixture was then applied onto the rubbed substrate by a spin coating method in an atmosphere at room temperature. The resulting coating film was dried at 80° C. for 10 minutes, and then irradiated with ultraviolet light through a mask having a pattern. The ultraviolet irradiation was performed at an intensity of 40 mW/cm$^2$ for 25 seconds using a high-pressure mercury-vapor lamp. The resulting cured film was washed with propylene glycol monomethyl ether acetate for one minute to remove uncured portions. An ultraviolet-curable epoxy acrylate resin was further applied by a spin coating method. Subsequently, the resulting product was irradiated with ultraviolet light at an intensity of 40 mW/cm$^2$ for 25 seconds using a high-pressure mercury-vapor lamp. Thus, a birefringent lens for a stereoscopic image display illustrated in FIG. 2 was obtained. The obtained birefringent lens for a stereoscopic image display of the present invention had no defect, and the alignment of the birefringent lens was also good. In the components except for cyclopentanone in the birefringent lens material (16) for a stereoscopic image display, the transition temperature from a solid phase to a liquid-crystalline phase was −26° C. and the transition temperature from a liquid-crystalline phase to a liquid phase was 96° C.

REFERENCE SIGNS LIST

1: resin mold
2: birefringent lens
3: substrate

The invention claimed is:

1. A method for producing a birefringent lens for a stereoscopic image display using a birefringent material, the method comprising the steps of:
   providing the birefringent lens material;
   applying the birefringent lens material onto an alignment layer that has been subjected to an alignment treatment in a uniaxial direction to obtain a coating film; and
   forming the coating film into a lens shape by conducting curing with ultraviolet light, wherein the birefringent lens material for a stereoscopic image display comprises;
   a first liquid crystal compound having at least one polymerizable functional group; and
   a second liquid crystal compound having at least one polymerizable functional group,
   wherein each of the first liquid crystal compound and the second liquid crystal compound is a compound represented by general formula (1):

$$P\text{-}(Sp)_m\text{-}MG\text{-}R^1 \qquad (1)$$

where P represents a polymerizable functional group; Sp represents a spacer group having 0 to 18 carbon atoms; m represents 0 or 1; MG represents a mesogenic group or a mesogenity supporting group; and R$^1$ represents a halogen atom, a cyano group, a thiocyanate group, a hydroxy group, an NCO group, an OCN group, or an alkyl group having 1 to 18 carbon atoms, the alkyl group optionally being substituted with at least one selected from halogen atoms, a cyano group, and a hydroxy group, and one CH$_2$ group or two or more non-adjacent CH$_2$ groups present in this group each optionally being independently substituted with a divalent organic group such as —O—, —S—, —NH—, —N(CH$_3$)—, —CO—, —COO—, —OCO—, —OCOO—, —SCO—, —COS—, —CH═CH—, or —C≡C— in such a manner that oxygen atoms are not directly bonded to each other, or R$^1$ represents a structure represented by general formula (1-a):

$$\text{-}(Sp)_m\text{-}P \qquad (1\text{-}a)$$

where P represents a polymerizable functional group, Sp represents a spacer group having 0 to 18 carbon atoms, and m represents 0 or 1
   wherein the birefringent lens material has a transition temperature from a solid phase to a liquid-crystalline phase of −10° C. or lower and a transition temperature from a liquid-crystalline phase to a liquid phase of 50° C. or higher.

2. The method for producing a birefringent lens for a stereoscopic image display according to claim 1, wherein the step of forming the coating film into a lens shape by conducting curing with ultraviolet light is a step of curing the coating film with ultraviolet light through a mask having a pattern, the coating film being composed of the birefringent lens material for a stereoscopic image display.

3. The method for producing a birefringent lens for a stereoscopic image display according to claim 1, wherein the step of forming the coating film into a lens shape by conducting curing with ultraviolet light is a step of covering, with a resin mold, the coating film composed of the birefringent lens material for a stereoscopic image display, and subsequently conducting curing with ultraviolet light.

4. The method for producing a birefringent lens for a stereoscopic image display according to claim 1, wherein the step of forming the coating film into a lens shape by conducting curing with ultraviolet light is a step of covering, with a resin mold, the coating film composed of the birefringent lens material for a stereoscopic image display, subsequently detaching the resin mold, then stacking, on the coating film, a resin having at least a polymerizable functional group, and conducting curing with ultraviolet light.

5. The method for producing a birefringent lens for a stereoscopic image display according to claim 1, wherein the first liquid crystal compound has at least two polymerizable functional groups; and
wherein the second liquid crystal compound has at least two polymerizable functional groups.

6. The method for producing a birefringent lens for a stereoscopic image display according to claim 1, wherein the coating film is formed into the lens shape by conducting curing at room temperature.

7. The method for producing a birefringent lens for a stereoscopic image display according to claim 1, wherein MG of the first liquid crystal compound is the same as that of the second liquid crystal compound.

8. The method for producing a birefringent lens for a stereoscopic image display according to claim 1, wherein the birefringent lens material further comprises:
a third liquid crystal compound having at least one polymerizable functional group; and
a fourth liquid crystal compound having at least one polymerizable functional group,
wherein each of the third liquid crystal compound and the fourth liquid crystal compound is a compound represented by said general formula (1),
wherein MG of the third liquid crystal compound is the same as that of the fourth liquid crystal compound,
MG of the first liquid crystal compound is different from that of the third liquid crystal compound.

9. The method for producing a birefringent lens for a stereoscopic image display according to claim 1, wherein, in general formula (1),
Sp represents a single bond or an alkylene group (where the alkylene group is optionally substituted with at least one selected from halogen atoms and CN, and one CH$_2$ group or two or more non-adjacent CH$_2$ groups present in this group is each optionally independently substituted with —O—, —S—, —NH—, —N(CH$_3$)—, —CO—, —COO—, —OCO—, —OCOO—, —SCO—, —COS—, —CONH—, —NHCO—, —CH=CH—, or —C≡C— in such a manner that oxygen atoms are not directly bonded to each other), and MG is represented by general formula (1-b):

-Z0-(A1-Z1)$_n$-A2-Z2-A3-Z3-  (1-b), where A1, A2, and A3 each independently represent a 1,4-phenylene group, a 1,4-cyclohexylene group, a 1,4-cyclohexenyl group, a tetrahydropyran-2,5-diyl group, a 1,3-dioxane-2,5-diyl group, a tetrahydrothiopyran-2,5-diyl group, a 1,4-bicyclo[2.2.2]octylene group, a decahydronaphthalene-2,6-diyl group, a pyridine-2,5-diyl group, a pyrimidine-2,5-diyl group, a pyrazine-2,5-diyl group, a thiophene-2,5-diyl group, a 1,2,3,4-tetrahydronaphthalene-2,6-diyl group, a 1,4-naphthylene group, a 1,5-naphthylene group, a 1,6-naphthylene group, a 2,6-naphthylene group, a phenanthrene-2,7-diyl group, a 9,10-dihydrophenanthrene-2,7-diyl group, a 1,2,3,4,4a,9,10a-octahydrophenanthrene-2,7-diyl group, a benzo[1,2-b:4,5-b']dithiophene-2,6-diyl group, a benzo[1,2-b:4,5-b']diselenophene-2,6-diyl group, a [1]benzothieno[3,2-b]thiophene-2,7-diyl group, a [1]benzoselenopheno[3,2-b]selenophene-2,7-diyl group, or a fluorene-2,7-diyl group, and optionally has at least one substituent selected from F, Cl, CF$_3$, OCF$_3$, a CN group, alkyl groups each having 1 to 8 carbon atoms, alkoxy groups each having 1 to 8 carbon atoms, alkanoyl groups each having 1 to 8 carbon atoms, alkanoyloxy groups each having 1 to 8 carbon atoms, alkenyl groups each having 2 to 8 carbon atoms, alkenyloxy groups each having 2 to 8 carbon atoms, alkenoyl groups each having 2 to 8 carbon atoms, and alkenoyloxy groups each having 2 to 8 carbon atoms; Z0, Z1, Z2, and Z3 each independently represent —COO—, —OCO—, —CH$_2$CH$_2$—, —OCH$_2$—, —CH$_2$O—, —CH=CH—, —C≡C—, —CH=CHCOO—, —OCOCH=CH—, —CH$_2$CH$_2$COO—, —CH$_2$CH$_2$OCO—, —COOCH$_2$CH$_2$—, —OCOCH$_2$CH$_2$—, —CONH—, —NHCO—, an alkylene group which has 2 to 10 carbon atoms and which optionally has a halogen atom, or a single bond; and n represents 0, 1, or 2.

10. The method for producing a birefringent lens for a stereoscopic image display according to claim 1, wherein in general formula (1), P represents a substituent selected from the group consisting of substituents represented by general formulae (P-1) to (P-18):

(P-1)

(P-2)

(P-3)

(P-4)

(P-5)

(P-6)

(P-7)

(P-8)

(P-9)

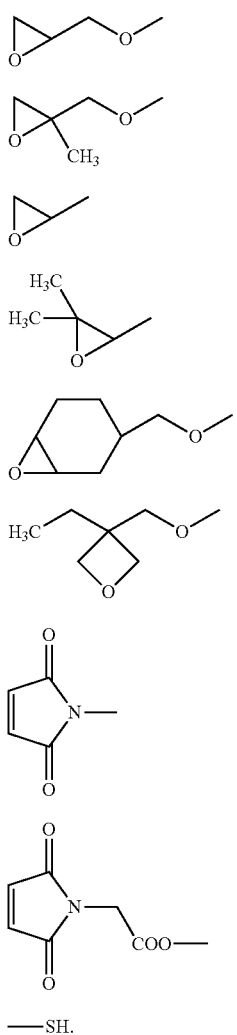

(P-10)
(P-11)
(P-12)
(P-13)
(P-14)
(P-15)
(P-16)
(P-17)
(P-18)

11. The method for producing a birefringent lens for a stereoscopic image display according to claim 1, wherein the birefringent lens material comprises a compound selected from the compound group represented by general formulae (2a) and (2b):

an integer of 2 to 18; and a 1,4-phenylene group present in the formulae optionally is substituted with at least one selected from alkyl groups each having 1 to 7 carbon atoms, alkoxy groups each having 1 to 7 carbon atoms, alkanoyl groups each having 1 to 7 carbon atoms, a cyano group, and halogen atoms.

12. The method for producing a birefringent lens for a stereoscopic image display according to claim 1, wherein the birefringent lens material comprises a compound selected from the compound group represented by general formulae (3) and (4):

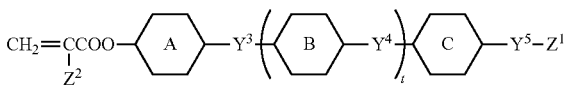

(3)

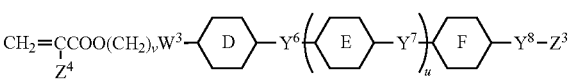

(4)

(where $Z^1$ and $Z^3$ each independently represent a hydrogen atom, a halogen atom, a cyano group, or a hydrocarbon group having 1 to 18 carbon atoms; $Z^2$ and $Z^4$ each independently represent a hydrogen atom or a methyl group; t and u each independently represent 0, 1, or 2; v represents an integer of 2 to 18; $W^3$ represents a single bond, —O—, —COO—, or —OCO—; A, B, C, D, E, and F each independently represent a 1,4-phenylene group, a 1,4-phenylene group in which non-adjacent CH groups are each substituted with nitrogen, a 1,4-cyclohexylene group, a 1,4-cyclohexylene group in which one or non-adjacent two $CH_2$ groups are each substituted with an oxygen or sulfur atom, a 1,4-cyclohexenyl group, a 1,4-bicyclo[2.2.2]octylene group, a decahydronaphthalene-2,6-diyl group, a pyridine-2,5-diyl group, a pyrimidine-2,5-diyl group, a pyrazine-2,5-diyl group, a 1,2,3,4-tetrahydronaphthalene-2,6-diyl group, a 2,6-naphthylene group, or a 1,4-naphthylene group, and a 1,4-phenylene group and a 2,6-naphthylene group that are present in the formulae is each optionally substituted with at least one selected from alkyl groups each having 1 to 7 carbon atoms, alkoxy groups each having 1 to 7 carbon atoms,

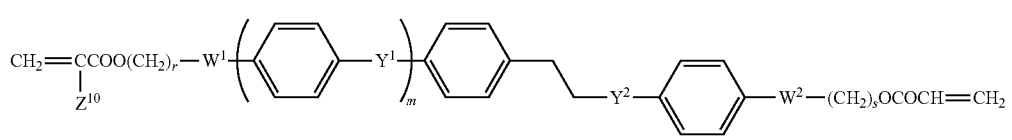

(2a)

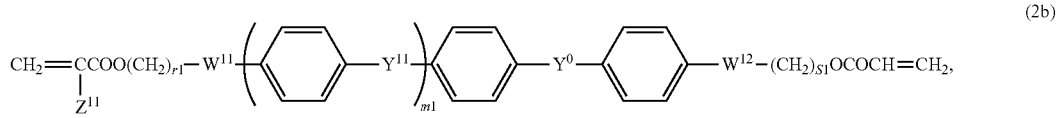

(2b)

where $Z^{10}$ and $Z^{11}$ each independently represent a hydrogen atom or a methyl group; m and m1 represent 0 or 1; $W^1$, $W^{11}$, $W^2$, and $W^{12}$ each independently represent a single bond, —O—, —COO—, or —OCO—; $Y^0$, $Y^1$, $Y_2$, and $Y^{11}$ each independently represent —COO— or —OCO—; r, r1, s, and s1 each independently represent alkanoyl groups each having 1 to 7 carbon atoms, a cyano group, and halogen atoms; $Y^3$, $Y^4$, $Y^6$, and $Y^7$ each independently represent a single bond, —$CH_2CH_2$—, —$CH_2O$—, —$OCH_2$—, —COO—, —OCO—, —C≡C—, —CH=CH—, —CF=CF—, —$(CH_2)_4$—, —$CH_2CH_2CH_2O$—, —OCH$_2$CH$_2$CH$_2$—, —CH=CHCH$_2$CH$_2$—, —CH$_2$CH$_2$CH=CH—, —CH=CHCOO—, —OCOCH=CH—, —CH$_2$CH$_2$COO—, —CH$_2$CH$_2$OCO—, —COOCH$_2$CH$_2$—, or —OCOCH$_2$CH$_2$—; and Y$^5$ and Y$^8$ each independently represent a single bond, —O—, —COO—, —OCO—, or —CH=CHCOO—).

* * * * *